(12) United States Patent
Chen et al.

(10) Patent No.: US 11,121,084 B2
(45) Date of Patent: Sep. 14, 2021

(54) INTEGRATED CIRCUIT DEVICE WITH THROUGH INTERCONNECT VIA AND METHODS OF MANUFACTURING THE SAME

(71) Applicant: Taiwan Semiconductor Manufacturing Co., Ltd., Hsinchu (TW)

(72) Inventors: Hsien-Wei Chen, Hsinchu (TW); Ching-Jung Yang, Taoyuan (TW); Jie Chen, New Taipei (TW); Ming-Fa Chen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 34 days.

(21) Appl. No.: 16/526,983

(22) Filed: Jul. 30, 2019

(65) Prior Publication Data
US 2021/0035907 A1 Feb. 4, 2021

(51) Int. Cl.
| | |
|---|---|
| *H01L 23/528* | (2006.01) |
| *H01L 23/00* | (2006.01) |
| *H01L 23/522* | (2006.01) |
| *H01L 21/768* | (2006.01) |
| *H01L 21/8234* | (2006.01) |

(52) U.S. Cl.
CPC .... *H01L 23/5283* (2013.01); *H01L 21/76802* (2013.01); *H01L 21/76843* (2013.01); *H01L 21/76877* (2013.01); *H01L 21/823475* (2013.01); *H01L 23/5226* (2013.01); *H01L 24/03* (2013.01); *H01L 24/05* (2013.01); *H01L 2224/05025* (2013.01)

(58) Field of Classification Search
CPC .................................................. H01L 23/5283
USPC ......................................................... 257/774
See application file for complete search history.

(56) References Cited

U.S. PATENT DOCUMENTS

| | | | | |
|---|---|---|---|---|
| 2004/0121586 | A1* | 6/2004 | Abell | H01L 21/76826 438/637 |
| 2006/0289968 | A1* | 12/2006 | Sulfridge | H01L 27/14601 257/621 |
| 2012/0248622 | A1* | 10/2012 | Sadaka | H01L 24/80 257/774 |
| 2014/0319522 | A1* | 10/2014 | Daubenspeck | H01L 24/13 257/48 |

FOREIGN PATENT DOCUMENTS

DE   102016117448 A1 *  6/2017  ....... H01L 21/76805

* cited by examiner

*Primary Examiner* — Ajay Arora
(74) *Attorney, Agent, or Firm* — JCIPRNET

(57) ABSTRACT

Integrated circuit devices and method of manufacturing the same are disclosed. An integrated circuit device includes an interconnect structure on a substrate, a passivation layer on the interconnect structure, a plurality of conductive pads on the passivation layer and a through interconnect via (TIV). The interconnect structure includes a plurality of dielectric layers and an interconnect in the plurality of dielectric layers. The plurality of conductive pads includes a first conductive pad electrically connecting the interconnect. The through interconnect via extends through the plurality of dielectric layers and electrically connecting a first conductive layer of the interconnect.

20 Claims, 20 Drawing Sheets

INTEGRATED CIRCUIT DEVICE WITH THROUGH INTERCONNECT VIA AND METHODS OF MANUFACTURING THE SAME

BACKGROUND

Generally, integrated circuits (ICs) comprise electronic components, such as transistors, capacitors, or the like, formed on a substrate. One or more metal layers are then formed over the electronic components to provide connections between the electronic components and to provide connections to external devices. The metal layers typically comprise an inter-layer dielectric (ILD) layer in which interconnect structures, such as vias and conductive lines, are formed, usually with a single- or dual-damascene process. The trend in the semiconductor industry is towards the miniaturization or scaling of integrated circuits, in order to provide smaller ICs and improve performance, such as increased speed and decreased power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
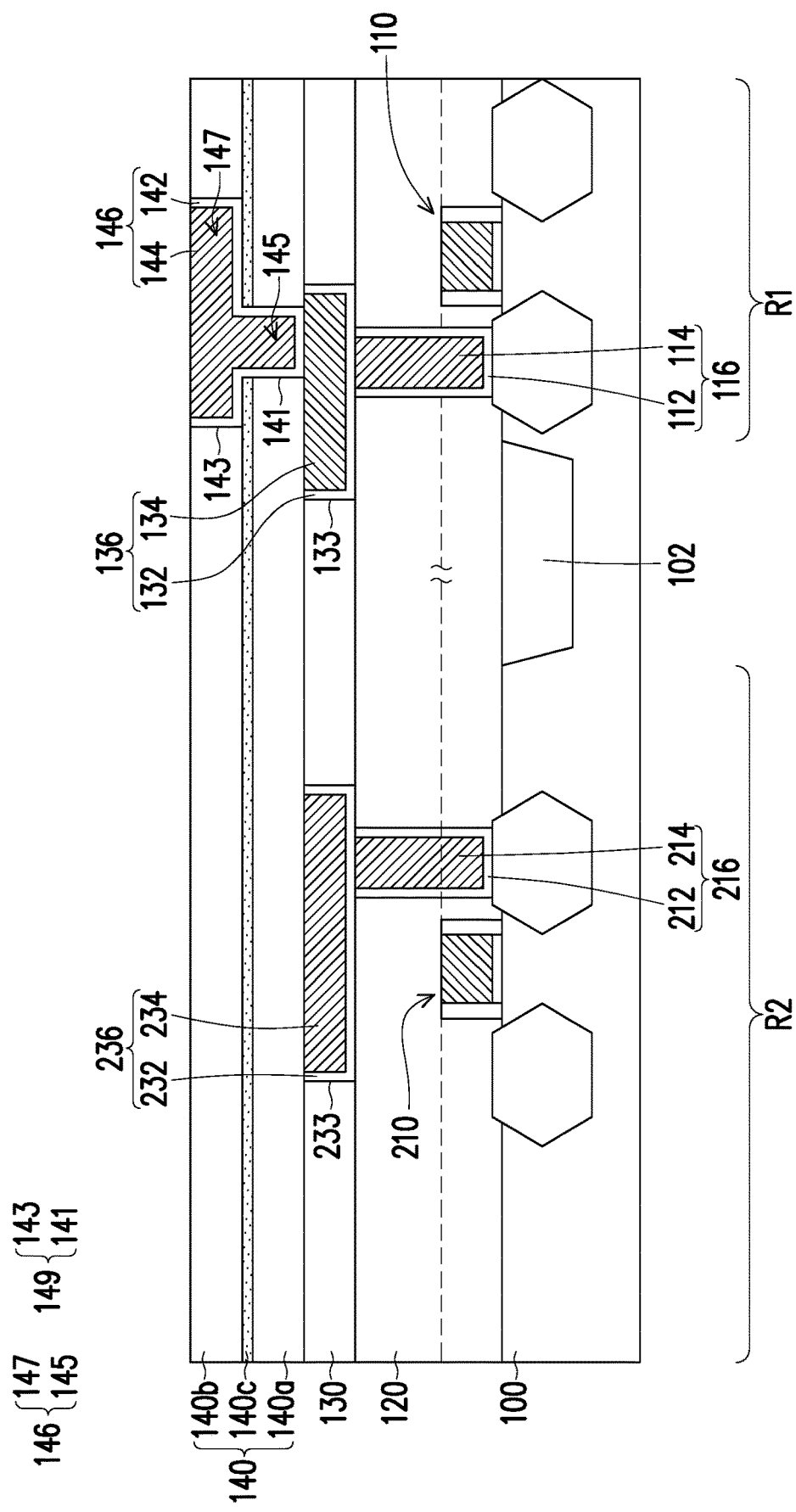
FIGS. 1A to 1G are schematic cross-sectional views illustrating a manufacturing process of an integrated circuit device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or over a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A to 1G are cross-sectional views illustrating a manufacturing process of an integrated circuit device in accordance with some embodiments of the disclosure. In order to simplify the drawing, some of the components (e.g., devices 110 and 210) in FIG. 1A are not shown in FIGS. 1B to 1G.

Referring to FIG. 1A, a substrate 100 is provided. In some embodiments, the substrate 100 is a semiconductor substrate, such as a bulk semiconductor substrate, a semiconductor-on-insulator (SOI) substrate, or the like, which may be doped (e.g., with a p-type or an n-type dopant) or undoped. The substrate 100 may be a wafer, such as a silicon wafer. Generally, an SOI substrate is a layer of a semiconductor material (such as silicon) formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 100 may include silicon; germanium; a compound semiconductor including silicon carbide (SiC), gallium arsenic (GaAs), gallium phosphide (GaP), indium phosphide (InP), indium arsenide (InAs), and/or indium antimonide (InSb); an alloy semiconductor including SiGe, GaAsP, AlInAs, AlGaAs, GaInAs, GaInP, and/or GaInAsP; or combinations thereof. Depending on the requirements of design, the substrate 100 may be a P-type substrate, an N-type substrate or a combination thereof and may have doped regions therein. In some embodiments, the substrate 100 for NMOS device or N-type FinFET device may include Si, SiP, SiC, SiPC, InP, GaAs, AlAs, InAs, InAlAs, InGaAs or combinations thereof. The substrate 100 for PMOS device or P-type FinFET device may include Si, SiGe, SiGeB, Ge, InSb, GaSb, InGaSb or combinations thereof.

The substrate 100 may include an isolation structure 102 formed therein or thereon. The isolation structure 102 formed to define a plurality of active regions. In some embodiments, the isolation structure 102 is a shallow trench isolation (STI) structure. The isolation structure 102 includes an insulation material, which may be an oxide, such as silicon oxide, a nitride, the like, or combinations thereof. A plurality of devices 110 and 210 may be formed within the active regions of the substrate 100. The devices may be active devices, passive devices, or combinations thereof. In some embodiments, the devices 110 and 210 are integrated circuit devices. The devices 110 and 210 are, for example, transistors, capacitors, resistors, diodes, photodiodes, fuse devices, or the like, or combinations thereof. In some embodiments, device 110 and 210 formed on and/or in the substrate 100. The device 110/210 may be an NMOS device, a PMOS device, an N-type FinFET device, a P-type FinFET device, other kinds of devices (such as, multiple-gate transistors, gate-all-around transistors or nanowire transistors) or combinations thereof. The disclosure is not limited thereto.

Figure 1B:
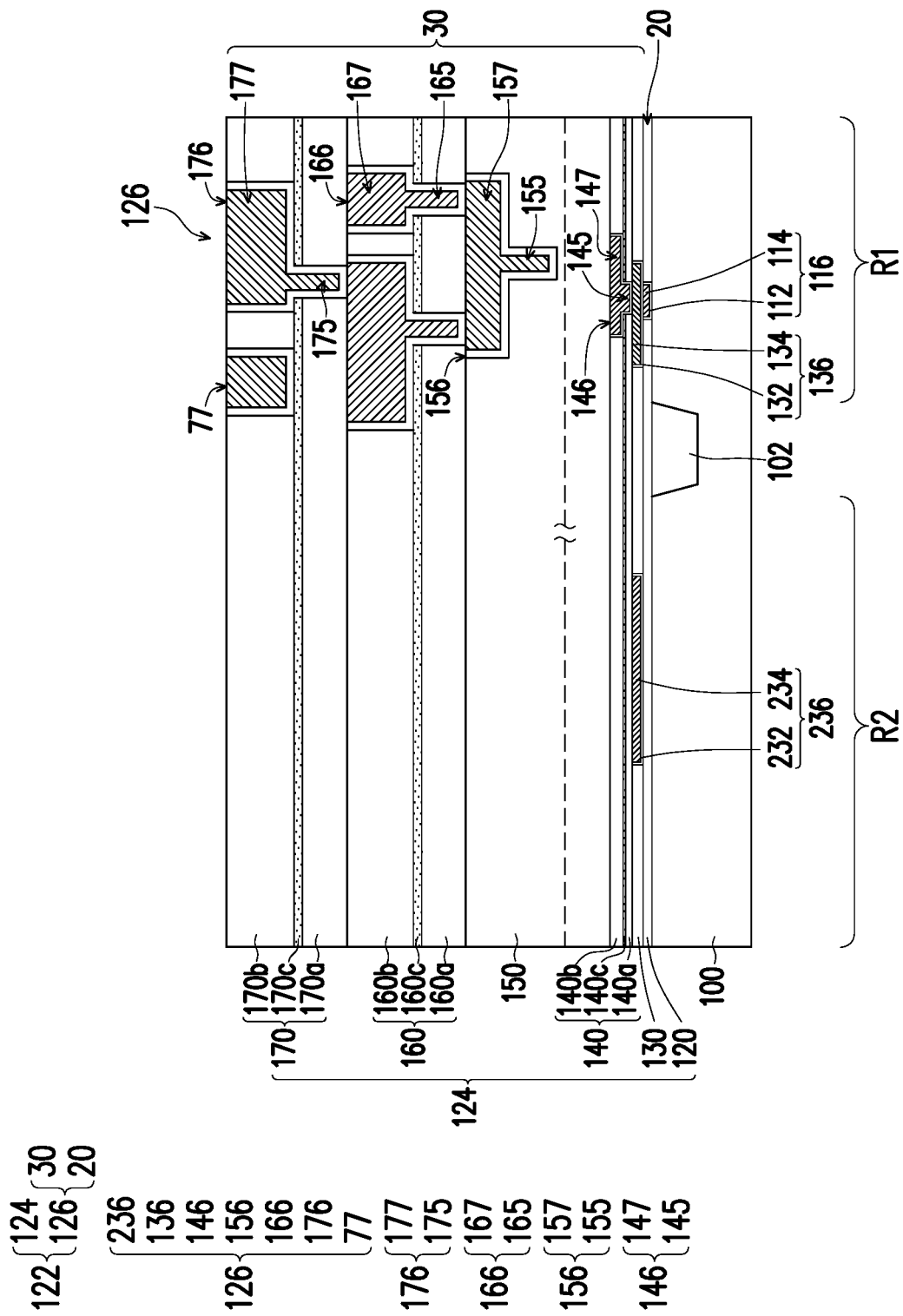
Figure 1C:
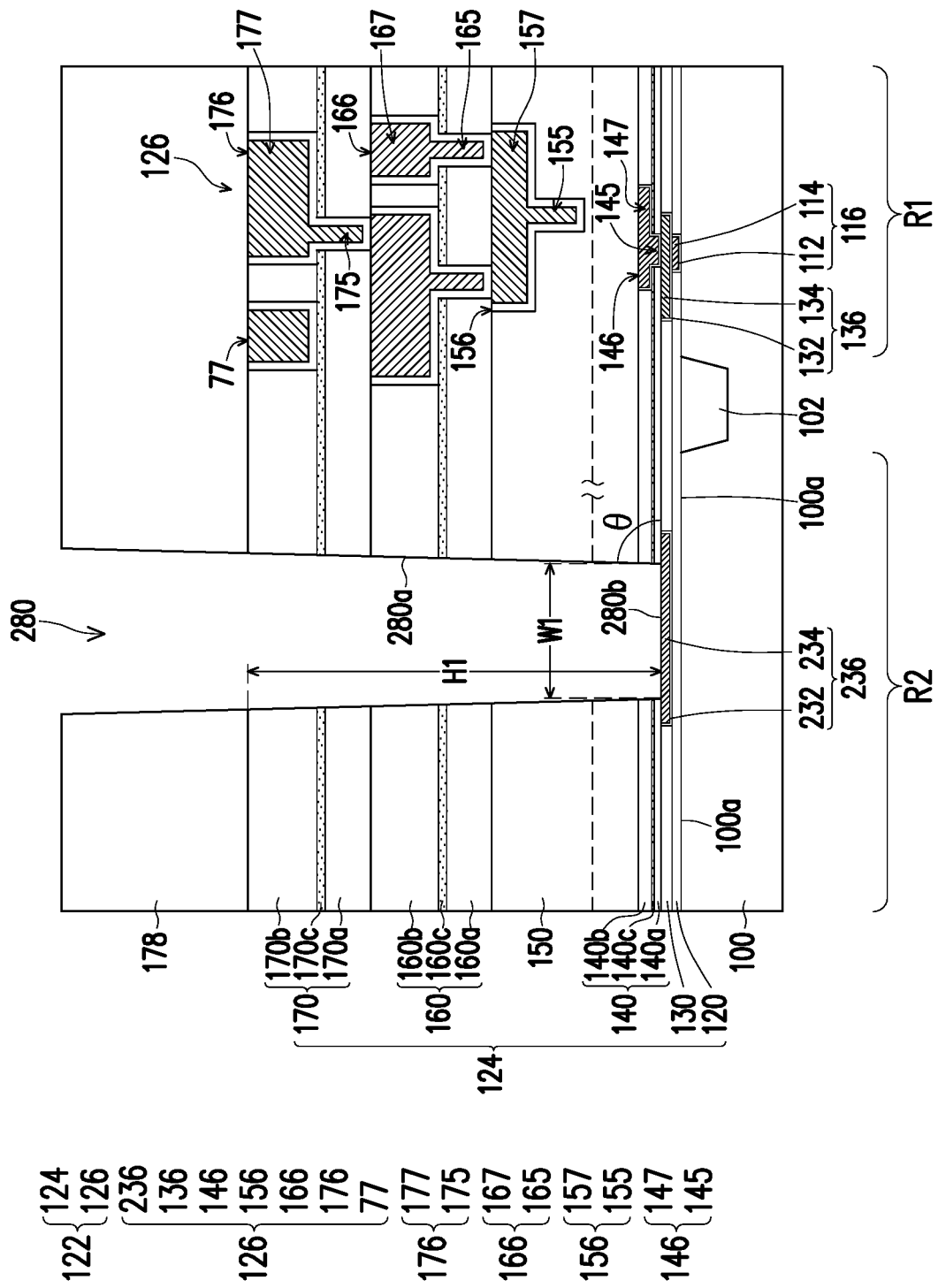
Figure 1D:
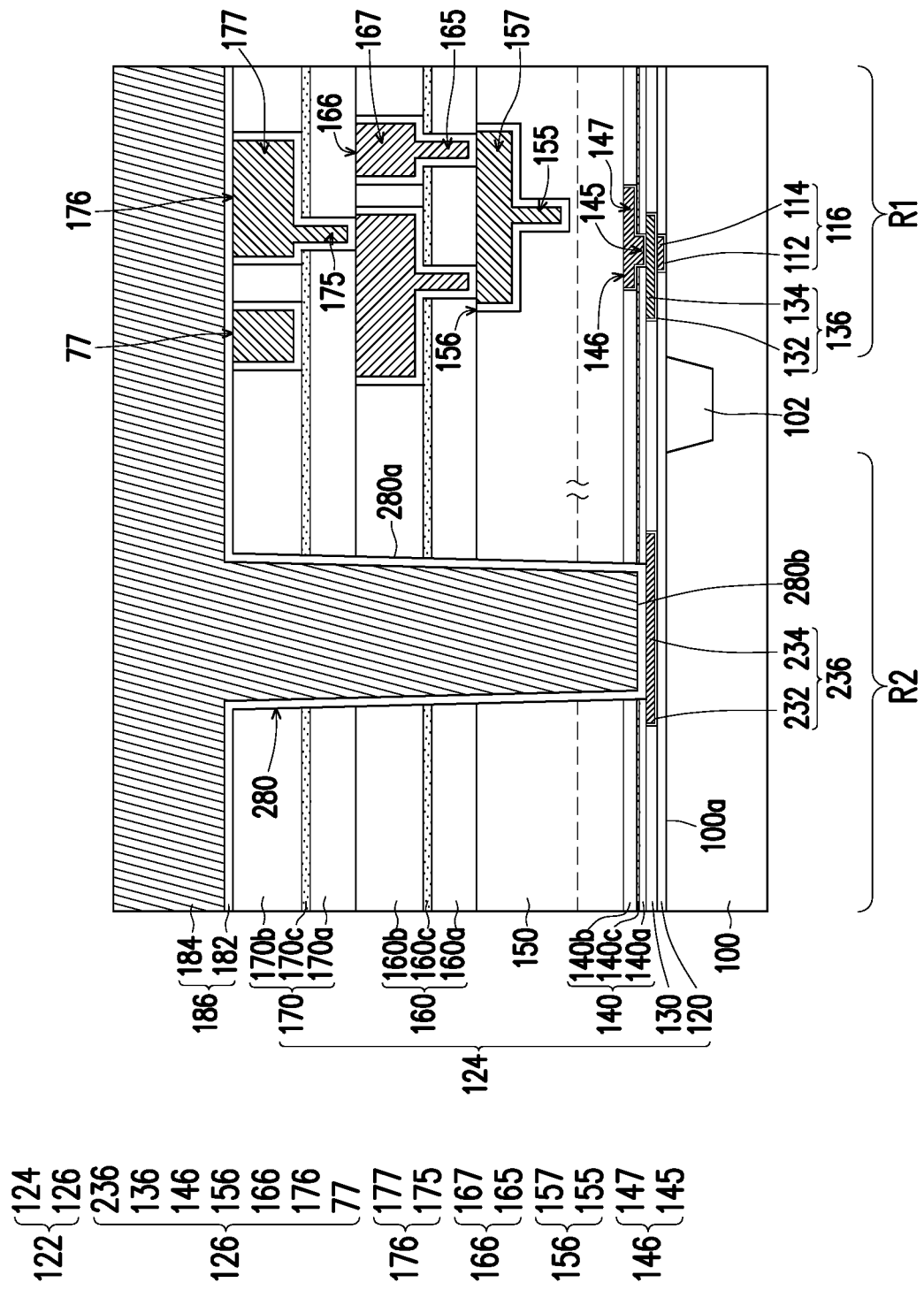
Figure 1E:
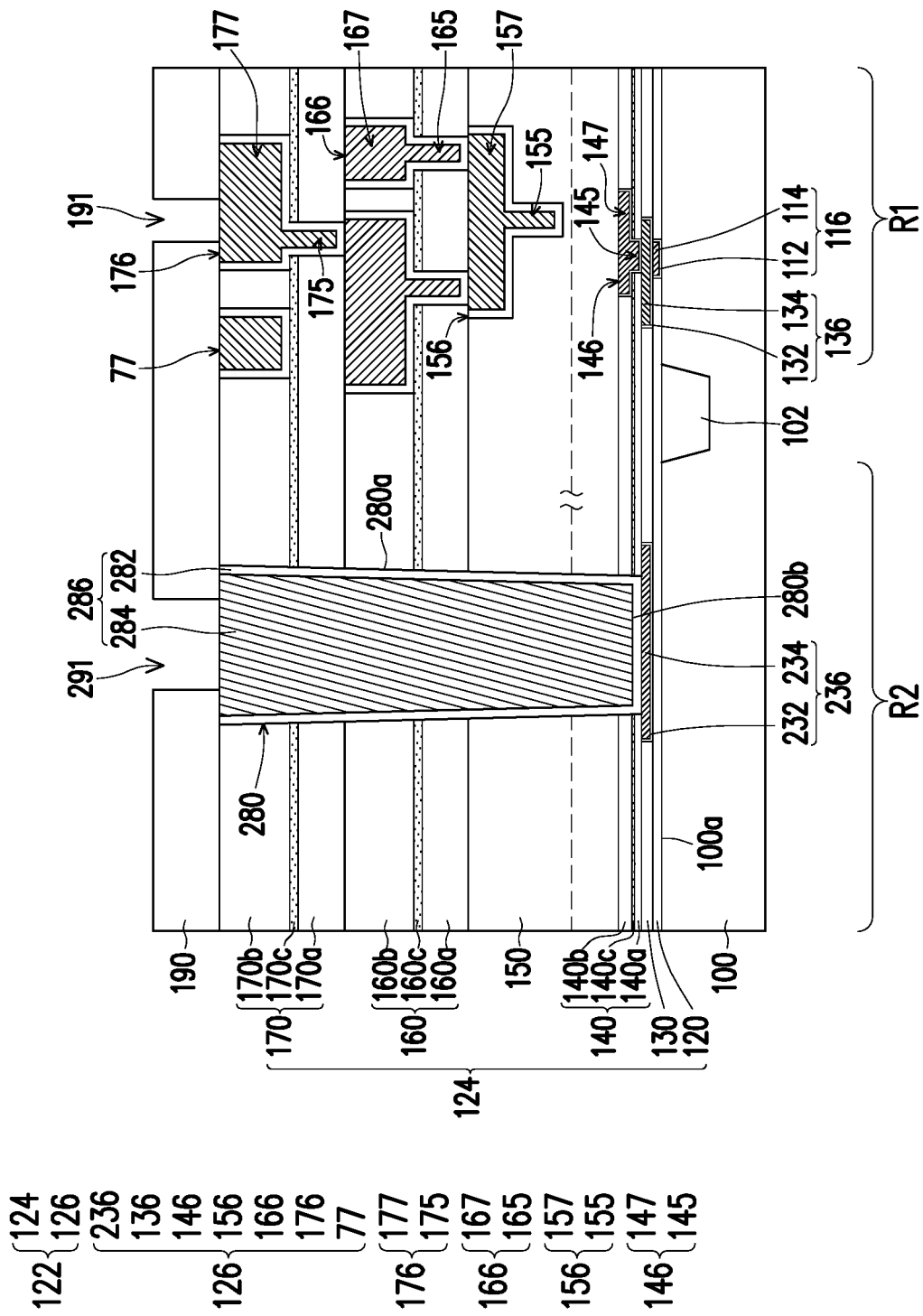
Figure 1F:
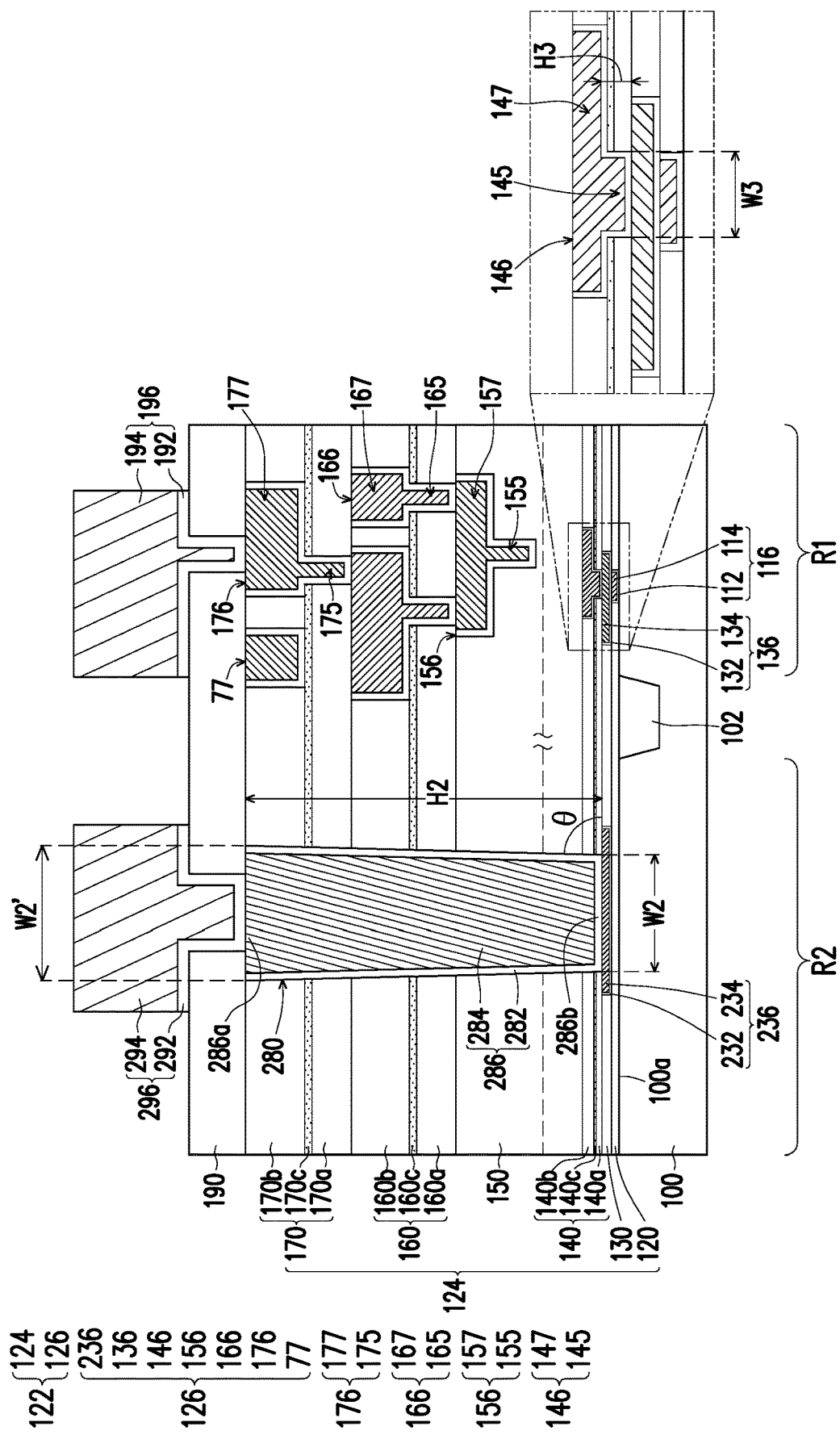
Figure 1G:
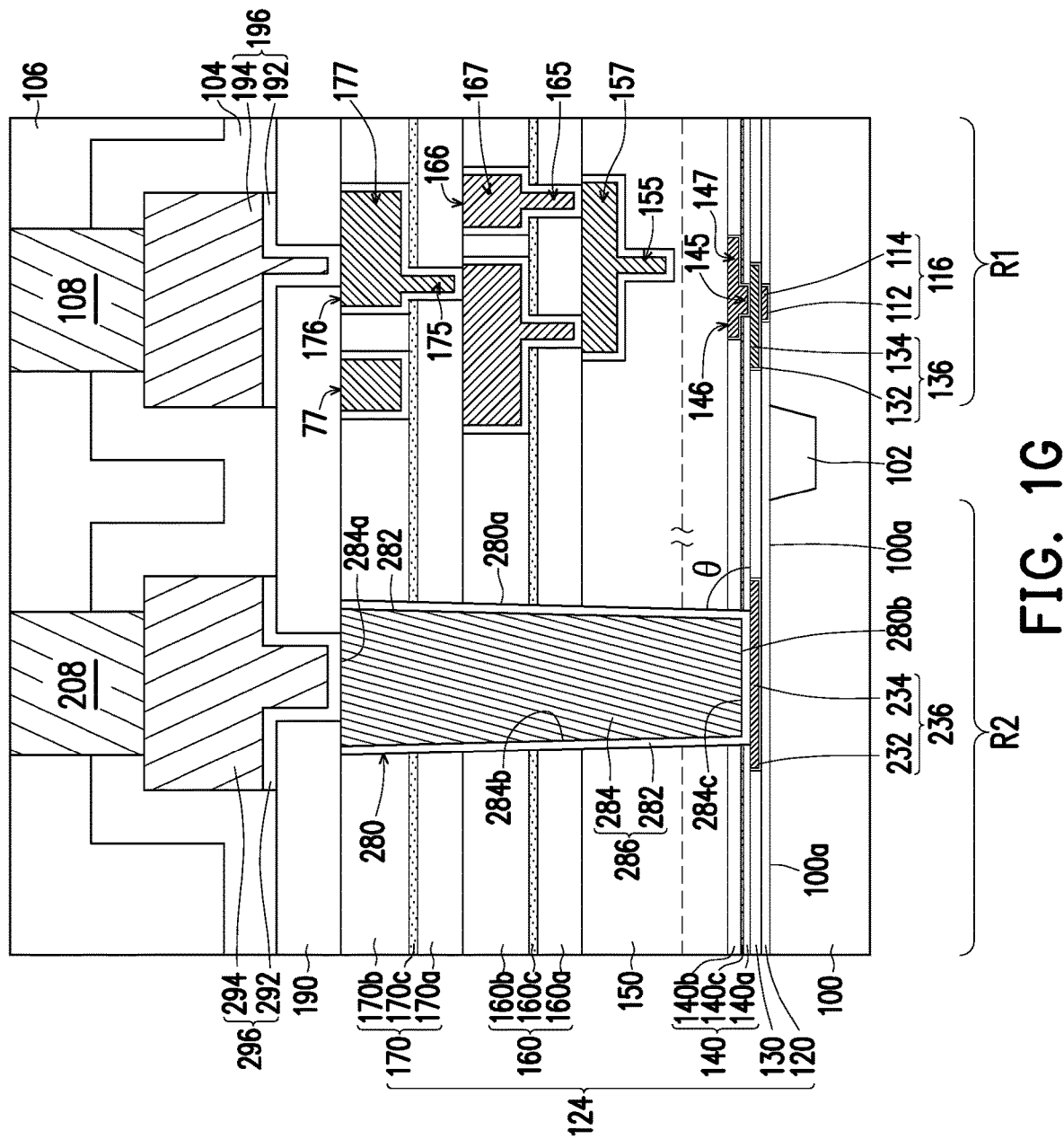

Referring to FIGS. 1A, 1B and 1G, an interconnect structure 122 is formed on the substrate 100. During operation of an integrated circuit device 200 (shown in FIG. 1G), the interconnect structure 122 is configured to route signals between the devices and/or the components of integrated circuit device 200 and/or distribute signals (for example, clock signals, voltage signals, and/or ground signals) to the devices and/or the components of integrated circuit device 200.

Referring to FIGS. 1A and 1B, the interconnect structure 122 may also referred to as a multilayer interconnect structure. The interconnect structure 122 includes a dielectric structure 124 disposed over the substrate 100 and an interconnect 126 disposed in the dielectric structure 124. The dielectric structure 124 includes a plurality of dielectric layers. The number of layers of the dielectric layers may be 2 to 19. In some embodiments, the dielectric structure 124 may include a dielectric layer 120 on the substrate 100 and dielectric layers 130, 140, 150, 160 and 170 on the dielectric layer 120, but the disclosure is not limited thereto. The dielectric layer 120 may be referred to as an inter-layer dielectric (ILD) layer, and the dielectric layers 130, 140, 150, 160 and 170 may be referred to as an inter-metal dielectric (IMD) layer.

In FIG. 1B, the dielectric layers 120 and 150 may represent one or more dielectric layers. Each dielectric layer 120, 130, 140, 150, 160, and 170 may include one or more dielectric material layer, respectively. The dielectric layers 120, 130, 140, 150, 160 and 170 include dielectric material including, for example, silicon oxide, silicon nitride, silicon oxynitride, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SiLK (Dow Chemical, Midland, Mich.), polyimide, other low-k dielectric material, or combinations thereof. In the depicted embodiment, the dielectric layers 120, 130, 140, 150, 160 or 170 is a dielectric layer that include a low-k dielectric material (generally referred to as low-k dielectric layers). The dielectric layers 120, 130, 140, 150, 160 and 170 may include a multilayer structure having multiple dielectric material layers. In some embodiments, the dielectric layers 140, 160 and 170 include dielectric material layers 140a, 140b, dielectric material layers 150a, 150b, dielectric material layers 160a, 160b, and dielectric material layers 170a, 170b. In some embodiments, dielectric material layers 140c, 150c, 160c, and 170c may be included in the dielectric layers 140, 160 and 170. The dielectric material layers 140c, 150c, 160c and 170c may be referred to as etch stop layers (CESLs).

In some implementations, CESLs (not shown) are also disposed in the dielectric layer 120, between substrate 100 and the dielectric layer 120, between the dielectric layer 120 and the dielectric layer 130, and/or between the dielectric layer 130 and the dielectric layer 140. The CESL include a material different than the dielectric layers 120, 130 and 140. In the depicted embodiment, where the dielectric layers 120, 130, 140, 150, 160 and 170 include a low-k dielectric material, the CESLs include nitride (for example, silicon nitride or silicon oxynitride). The dielectric layers 120, 130, 140, 150, 160 and 170 and the CESLs may be formed by a deposition process, such as CVD, PVD, ALD, PECVD, HDPCVD, MOCVD, RPCVD, LPCVD, ALCVD, APCVD, spin-on dielectric, plating, other suitable methods, or combinations thereof. In some implementations, the dielectric layers 120, 130, 140, 150, 160 and 170 and/or the CESL are formed by a flowable CVD (FCVD) process that includes, for example, depositing a flowable material (such as a liquid compound) over substrate 100 and converting the flowable material to a solid material by a suitable technique, such as thermal annealing and/or ultraviolet radiation treating. Subsequent to the deposition of the layers 120, 130, 140, 150, 160 and 170 and/or the CESLs, a CMP process and/or other planarization process is performed, such that dielectric layer 120 and/or the CESLs have substantially planar surfaces.

The interconnect 126 is configured to form vertical interconnect features, such as contacts and/or vias, and/or horizontal interconnect features, such as conductive lines. Vertical interconnect features typically connect horizontal interconnect features in different layers (or different planes) of the interconnect 126. The interconnect 126 may include multilayer interconnect (MLI) feature 20 disposed on the substrate 100 and MLI feature 30 disposed over the MLI feature 20. The MLI feature 20 electrically couples various devices (for example, transistors, resistors, capacitors, and/or inductors) and/or components (for example, gate structures and/or source/drain features) of integrated circuit device 200 (shown in FIG. 1G), and the MLI feature 30 electrically couples the MLI feature 20 and a pad 196 (shown in FIG. 1G), such that the various devices and/or components may operate as specified by design requirements of integrated circuit device 200. In other words, in some embodiments, the MLI feature 20 is a MEOL conductive feature that interconnect FEOL conductive features (for example, gate structures and/or epitaxial source/drain features) to BEOL conductive features (for example, the conductive layers 136 and 236). The MLI feature 30 is a BEOL conductive feature that interconnect the MEOL conductive features to a pad (for example, the pad 196 shown in FIG. 1G).

Referring to FIGS. 1A and 1B, the MLI feature 20 is formed in the dielectric layer 120, and the MLI feature 20 may include contacts (or referred to as device-level contacts) 116 and 216. In some implementations, the contacts 116 and 216 are metal-to-device (MD) contacts, which generally refer to contacts to a conductive region of the devices 110 and 210, such as source/drain regions, respectively. In alternate implementations, the contacts 116 and 216 are the MEOL conductive features that interconnect the FEOL conductive features (for example, gate structures and/or epitaxial source/drain features) to BEOL conductive features (for example, vias), thereby electrically and/or physically coupling FEOL conductive features to BEOL conductive features. In alternate embodiments, the MLI feature 20 may include a metal-to-poly (MP) contact (not shown), which generally refers to a contact to a gate structure, such as a poly gate structure or a metal gate structure. It is noted that though the dielectric layer 120 and the contacts 116 and 216 are depicted with a given number of dielectric layer and contacts, the present disclosure contemplates the dielectric layer 120 and the contacts 116 and 216 having more stacked dielectric layers and stacked contacts (or a stacked structure including contacts and vias stacked on the contacts) depending on design requirements of integrated circuit device 200 (shown in FIG. 1G).

The MLI feature 30 may include a plurality of conductive layers 136, 147, 157, 167, 177, 236 and a plurality of vias 145, 155, 165, 175. In some embodiments, the conductive layer 136 is connected to the contacts 116 of the MEOL conductive features and the via 145 of the BEOL conductive features. The via 145 are BEOL conductive feature that interconnect BEOL conductive features in the same dielectric layer to another dielectric layer, such as the conductive layer 147 to the conductive layer 136 disposed in other dielectric layers 130 underlying dielectric layer 140, thereby electrically and/or physically coupling BEOL conductive features of integrated circuit device 200. The conductive layer 147 and the via 145 in the same dielectric layer 140 may be collectively referred to as a conductive feature 146. The vias 155, 165, 175 are respectively connected to the conductive layers 157, 167, 177 in the same dielectric layers 150, 160, 170 and the conductive layers 147, 157, 167 in the underlying dielectric layers 140, 150, 160. The conductive layer 157 and the via 155, the conductive layer 167 and the via 165, the conductive layer 177 and the via 175 may be collectively referred to as conductive features 156, 166, 176, respectively.

Referring to FIG. 1A, the contacts 116 and 216 may be formed in the dielectric layer 120 by a single-damascene process, for example. In some embodiments, the contact 116/216 may include a barrier layer 112/212 and a conductive bulk 114/214. The barrier layer 112/212 is, for example, a metal, a metal nitride or a combination thereof. In some embodiments, the barrier material layer includes TiN, TaN, WN, CoN, MnN, self-assembled monolayers including silane, silanol, or silyl hydride, other suitable material, or combinations thereof, and may be formed by a chemical vapor deposition method, a sputtering method, or a plating method. The conductive bulk 114/214 may be a metal, a metal alloy or a combination thereof, and may be formed by a chemical vapor deposition method, a sputtering method, or a plating method. The metal is, for example, W, Co, Ru, Cu, Al, other suitable conductive materials.

In alternate embodiments, the contacts 116 and 216 may include the conductive bulk 114 and 214, and not include the barrier layer 112 and 212.

Referring to FIG. 1A, after the contacts 116 and 216 are formed, the dielectric layer 130 and the conductive layers 136, 236 may be formed. The conductive layer 136 is formed on and is in electrical contact with the contact 116. The conductive layer 236 is formed on and is in electrical contact with the contact 216. In some embodiments, the conductive layer 136 and 236 may be formed by a single damascene process. First, a dielectric material layer (not shown) is formed on the dielectric layer 120. Next, the dielectric material layer is planarized using a chemical mechanical polishing process (CMP) to form the dielectric layer 130. Then, trenches 133 and 233 are formed in the dielectric layer 130 using lithography and etching processes. After that, a conductive material layer is formed on the substrate 100. In some embodiments, the conductive material layer covers the dielectric layer 130 and is filled in the trenches 133 and 233. The conductive material layer may be a metal, a metal alloy or a combination thereof, and may be formed by a chemical vapor deposition method, a sputtering method, or a plating method. The metal includes Co, Ru, Cu, Al, other suitable conductive materials, or combinations thereof, and may be formed by a chemical vapor deposition method, a sputtering method, or a plating method.

In some embodiments, a barrier material layer may be formed prior to forming the conductive material layer. The barrier material layer is, for example, a metal, a metal nitride or a combination thereof. In some embodiments, the barrier material layer includes TiN, TaN, WN, CoN, MnN, other suitable materials, or combinations thereof or a combination thereof, and may be formed by a chemical vapor deposition method, a sputtering method, or a plating method. The conductive material layer and the barrier material layer on the surface of the dielectric layer 130 are removed by a chemical mechanical polishing process, and the conductive patterns 134, 234 and the barrier layers 132, 232 remain in the trenches 133 and 233. The conductive pattern 134 and the barrier layer 132 remaining in the trench 133 may be collectively referred to as the conductive layer 136. The conductive pattern 234 and the barrier layer 232 remaining in the trench 233 may be collectively referred to as the conductive layer 236. In some embodiments, the top surface of dielectric layer 130 may be coplanar with the top surfaces of conductive layers 136, 236.

In some alternate embodiments, the conductive layers 136, 236 and the dielectric layer 130 may also be formed by deposition and patterning processes. First, a barrier material layer and a conductive material layer are formed on the dielectric layer 120. Then, the conductive material layer and the barrier material layer are patterned by using lithography and etching processes to form the conductive patterns 134, 234 and the barrier layers 132, 232. A dielectric material layer is formed and then planarized using a chemical mechanical polishing process to form the dielectric layer 130.

Referring to FIGS. 1A and 1B, after the dielectric layer 130 and the conductive layers 136, 236 are formed, the dielectric layers 140, 150, 160, 170 and the conductive features 146, 156, 166, 176 are formed on the substrate 100. The dielectric layers 140, 150, 160, 170 and the conductive features 146, 156, 166, 176 may be formed by various known methods. In some embodiments, the dielectric layers 140, 150, 160, 170 and the conductive features 146, 156, 166, 176 may be formed in dual damascene processes. In some embodiments, the dielectric layer 140 may be formed on the substrate 100, and then a dual damascene opening 149 is formed in the dielectric layer 140 using a lithography and etching process. The dual damascene opening 149 includes a via opening 141 and a trench 143 above the via opening 141 and in communication with the via opening 141. Thereafter, the conductive material layer covers the dielectric layer 140 and is filled in the dual damascene opening 149. In some embodiments, a barrier material layer may be formed prior to forming the conductive material layer. The barrier material layer covers the dielectric layer 140 and the sidewalls and bottom surface of the dual damascene opening 149. The conductive material layer and the barrier material layer on the dielectric layer 140 are then removed via a chemical mechanical polishing process to leave a conductive material layer 144 and a barrier material layer 142 in the dual damascene openings 149. The conductive material layer 144 and the barrier material layer 142 remaining in the via opening 141 form the via 145. The conductive material layer 144 and the barrier material layer 142 remaining in the trench 143 form the conductive layer 147. However, the disclosure is not limited thereto, and the method of forming the dual damascene opening 149 may be any known method.

Referring to FIG. 1A, in some embodiments, the dielectric layer 140 includes a dielectric material layer 140a, a dielectric material layer 140b and a dielectric material layer 140c therebetween. The dielectric material layer 140c may be used as a stop layer or a mask layer during the patterning process for forming the via opening of the dual damascene opening 149. After the dielectric material layer 140a is formed, a dielectric material layer 140c with a via opening pattern is formed on the dielectric layer 140a. Thereafter, the dielectric material layer 140b is formed on the dielectric material layer 140c. The dielectric material layer 140b is etched by using a mask layer with a trench pattern, the trench 143 is formed in the dielectric material layer 140b, and then the dielectric material layer 140c is used as an etch mask to continue the etching process, and the via opening 141 is formed in the dielectric material layer 140a.

In some alternate embodiments, the dielectric material layer 140c may be omitted. The dielectric layer 140 may include the dielectric material layer 140a and the dielectric material layer 140b on the dielectric material layer 140a. The dual damascene opening 149 may be formed by forming a via opening 141 penetrating the dielectric material layers 140a and 140b, and then forming a trench 143 disposed in the dielectric material layer 140b. In other embodiments, the dual damascene opening 149 may be formed by first forming a trench 143 in the dielectric material layer 140b, and then forming a via opening 141 in the dielectric material layer 140a.

In other embodiments, the dielectric layers 140, 150, 160, 170 and the conductive features 146, 156, 166, 176 may be formed in single damascene processes. The dielectric material layer 140a may be formed on the substrate 100, and then the dielectric material layer 140a is patterned by a lithography and etching process to form a via opening 141. Next, a barrier material layer and a conductive material layer are formed on the dielectric material layer 140a and filled into the via opening 141. Thereafter, the conductive material layer and the barrier material layer on the dielectric material layer are removed via a chemical mechanical polishing process to form the via 145 in the via opening 141. Thereafter, another barrier material layer and another conductive material layer are formed on the dielectric material layer 140a, and then patterned by a lithography and etching process to form the conductive layer 147. The dielectric material layer is formed over the substrate 100 and a chemical mechanical polishing process is performed so as to form the dielectric material layer 140b around the conductive layer 147.

Thereafter, the above process is repeated to form the interconnect structure 122. In some embodiments, the dielectric layer 170 is also referred to as a top dielectric layer, and the conductive layer 177 is also referred to as a topmost conductive layer, a topmost conductive line, a topmost wire, a topmost metal wire, a topmost metal layer, a topmost routing, a topmost trace, or a topmost metal line. In addition, the conductive layers 136, 236 are also referred to as bottommost conductive layers, bottommost conductive lines, bottommost wires, bottommost metal layers, bottommost metal lines, bottommost routings, bottommost traces, bottommost metal wires, first metal layers, first wires, first metal wires, zero metal layers, zero wires, or zero metal wires. The interconnect structure 122 may also include some dummy conductive layers laterally aside or around the conductive layers 136, 236, 147, 157, 167 or 177. In some embodiments, the interconnect structure 122 may also include a dummy conductive layer 77 laterally aside the conductive layer 177. The dummy conductive layer 77 may be not connected to other conductive layers, vias, or not electrically connected to an external circuit.

Referring to FIG. 1B and FIG. 1C, after forming the interconnect structure 122, a mask layer 178 is formed on the substrate 100. The mask layer 178 may be a patterned photoresist layer, for example. Then, an etching process is performed using the mask layer 178 as a mask to form a through interconnect via (TIV) opening 280. The etching process may be an anisotropic etching process. In some embodiments, the anisotropic etching process may employ a dry etching process such as an RIE etching process. The etching process may use $CF_4$ and $SiF_4$ as etching gases, for example.

The conductive layer 136 of the interconnect structure 122 may be formed in a first region R1 of the substrate 100; the conductive layer 236 may be formed in a second region R2 of the substrate 100, but the disclosure is not limited thereto. In some embodiments, the first region R1 is an (input/output) I/O region, a core region, or a SRAM region; and the second region R2 is an I/O region. The through interconnect via opening 280 exposes the conductive layer 236 of the interconnect structure 122 in the second region R2. In an exemplary embodiment, the conductive layers 136, 236 are the zero conductive layers or the first conductive layers (or referred to as zero metal layers, zero metal lines, first metal layers, first metal lines, bottommost metal layers, and bottommost metal lines) of the interconnect structure 122. The through interconnect via opening 280 has a sidewall 280a, and an included angle θ is between the extension line of the sidewall 280a of the through interconnect via opening 280 and the surface 100a of the substrate 100. In some embodiments, the sidewall 280a is tapered, and the included angle θ may range from 84 to 89 degrees, such as 85 degrees, 86 degrees, 87 degrees, or 88 degrees. However, the disclosure is not limited thereto. In some alternate embodiments, the through interconnect via opening 280 may have a vertical sidewall 280a, that is, the included angle θ is 90 degrees. In some alternate embodiments, the through interconnect via opening 280 may have a constant width from top to bottom. In some embodiments, the aspect ratio of the through interconnect via opening 280 is defined as the ratio of a depth H1 to a top width W1' of the through interconnect via opening 280, where the depth H1 is measured from the bottom end to the top end of the through interconnect via opening 280. In some embodiments, the aspect ratio may be in a range of 1 to 2. The width of the aspect ratio refers to the top width W1' of the top end of the through interconnect via opening 280, and the height of the aspect ratio refers to the height H1 measured from the top end to the bottom end of the through interconnect via opening 280.

Referring to FIGS. 1C and 1D, the mask layer 178 is removed by stripping, for example. Thereafter, a barrier material layer 182 is formed over the substrate 100. The barrier material layer 182 covers the dielectric layer 170 and the sidewalls 280a and the bottom surface 280b of the through interconnect via opening 280. In some embodiments, the barrier material layer 182 is a conformal layer. That is, the barrier material layer 182 has a substantially uniform thickness over the dielectric layer 170 and the sidewalls 280a and the bottom surface 280b of the through interconnect via opening 280. The thickness of the barrier material layer 182 ranges, for example, from 800 angstroms to 2,500 angstroms. The barrier material layer 182 is, for example, a metal, a metal nitride, or a combination thereof. The barrier material layer 182 includes titanium, tantalum, titanium nitride, tantalum nitride, or a combination thereof, and may be formed by chemical vapor deposition, sputtering, or a combination thereof.

Thereafter, a conductive fill material layer 184 is formed over the barrier material layer 182. The conductive fill material layer 184 overlies the barrier material layer 182 on the dielectric layer 170 and fills the through interconnect via opening 280. The conductive filling material layer 184 may be a metal, a metal alloy or a combination thereof, and may be formed by a chemical vapor deposition method, a sputtering method, or a plating method. In some embodiments, the conductive fill material layer 184 may be formed by first forming a seed layer on the barrier material layer 182 by sputtering, and then forming a metal layer on the seed layer by electroplating. The thickness of the seed layer ranges, for example, from 3,000 angstroms to 7,000 angstroms. The conductive filling material layer 184 may include a copper-containing seed layer and a copper-containing fill layer disposed over the copper-containing seed layer. In the depicted embodiment, the conductive filling material layer 184 includes a conductive material having a lower resistivity than copper, such as a cobalt-containing fill layer or a ruthenium-containing fill layer. In the depicted embodiment, the conductive filling material layer 184 is formed by PVD, CVD, ALD, electroplating, electroless plating, other suitable deposition process, or combinations thereof. Since the aspect ratio of the through interconnect via opening 280 is not large, the barrier material layer 182 and the conductive fill material layer 184 may be easily filled into the through interconnect via opening 280.

Referring to FIG. 1D and FIG. 1E, a planarization process is performed to remove the conductive fill material layer 184 and the barrier material layer 182 on the dielectric layer 170. The planarization process may be a chemical mechanical polishing process or an etch back process. The conductive filling layer 284 and the barrier layer 282 remaining in the through interconnect via opening 280 may be collectively referred to as a through interconnect via (TIV) 286.

Referring to FIG. 1E, a passivation layer 190 is formed on the substrate 100. The passivation layer 190 covers the dielectric layer 170 and a TIV 286. The passivation layer 190 may be a single layer or a multi-layer. The material of the passivation layer 190 includes a dielectric material, a polymer material, or a combination thereof. The material of the passivation layer 190 is, for example, silicon oxide, silicon nitride, polyimide or a combination thereof. The method of forming the passivation layer 190 may include chemical vapor deposition or spin coating. Thereafter, the passivation layer 190 is patterned to form openings 291 and openings 191 in the passivation layer 190. The openings 291 expose the TIV 286; the openings 191 expose the top conductive layer 177.

Referring to FIG. 1F, a conductive pad 296 and a conductive pad 196 are formed on the passivation layer 190. In some embodiments, the conductive pads 196 and 296 may be also referred to as pads. The pad 296 is in electrical contact with the TIV 286; the pad 196 is in electrical contact with the top conductive layer 177. The pad 296 includes a barrier layer 292 and a conductive layer 294 on the barrier layer 292. The pad 196 includes a barrier layer 192 and a conductive layer 194 on the barrier layer 192. In some embodiments, the barrier layer 292 of the pad 296 is in physical contact with the conductive filling layer 284 of the TIV 286, and the barrier layer 192 of the pad 196 is in physical contact with the top conductive layer 177.

Referring to FIG. 1G, after the pads 196 and 296 are formed, the passivation layers 104, 106 and connectors (or referred to as conductive pillar) 108 and 208 may be formed over the substrate 100. The passivation layers 104 and 106 are, for example, polyamines, PBO, or a combination thereof. The passivation layers 104 and 106 may be formed by spin coating or lamination. The passivation layers 104 and 106 may also be referred to as PMO. The material of the connectors 108 and 208 includes a metal, such as copper, which may be formed by electroplating. At this point, the fabrication of the semiconductor element 200 is complete. Thereafter, a wafer dicing process may be performed on the semiconductor device 200 to form a plurality of dies. Alternatively, the semiconductor device 200 may further be bonded to other dies.

Referring to FIG. 1F, in some embodiments, the conductive layer 236 is connected to the contacts 216 of the MEOL conductive features and the TIV 286 of the BEOL conductive features. The TIV 286 is a BEOL conductive features that interconnect BEOL conductive features in different dielectric layer to a pad, such as the conductive layer 236 to the pad 296 disposed in and on passivation layers 190 overlying the dielectric layer 170, thereby electrically and/or physically coupling BEOL conductive feature and the pad of integrated circuit device 200.

the TIV 286 extends through the plurality of dielectric layers 170, 160, 150, and 140. The top surface 286a of the TIV 286 may be coplanar with the top surfaces of the conductive layer 177, the dummy conductive layer 77 and the dielectric material layer 170b. The bottom surface 286b of the TIV 286 may be coplanar with the top surfaces of the conductive layers 136, 236 and the dielectric layer 130. The top surface 286a of the TIV 286 is in physical contact with the pad 296 and the passivation layer 190. The bottom surface 286b of the through interconnect via 286 is in physical contact with the bottom conductive layer 236 of the interconnect 126. In other words, the TIV 286 extends through all of the IMD layers (e.g. 140, 150, 160, 170) between the passivation layer 190 and the first IMD layer 130. The TIV 286 penetrates through the number of IMD layers, such as two layers to 15 layers.

Referring to FIG. 1F, the TIV 286 extends through all of the IMD layers between the passivation layer and the first IMD layer 130, and the TIV 286 has a large width. A bottom width W2 of the TIV 286 ranges, for example, from 1.5 µm to 15 µm. A top width W2' of the TIV 286 ranges, for example, from 2 µm to 15.5 µm. A height H2 of the TIV 286 is, for example, 2 µm to 3 µm. The aspect ratio of the TIV 286 ranges from 1 to 2, for example, 1.7. The width of the aspect ratio refers to the top width W2' of the top end of the through interconnect via 286, and the height of the aspect ratio refers to the height H2 measured from the top end to the bottom end of the TIV 286.

Referring to FIG. 1F, the bottom width W2 of the TIV 286 is greater than the bottom width of the vias 145, 155, 165, 175. In some embodiments, the bottom width W2 of the through interconnect via 286 is 60 times to 17500 times a bottom width W3 of a via (e.g. the via 145) of the interconnect 126. The height H2 of the TIV 286 is greater than a height H3 of a via (e.g. the via 145) in the interconnect 126. The H3 is measured from a top end to a bottom end of the via (e.g. the via 145). In some embodiments, the height H2 of the TIV 286 is 5 times to 40 times the height H3 of a via (e.g. the via 145) of the interconnect 126. The cross-sectional area of the TIV 286 at a height may be greater than the cross-sectional area of a via (e.g. the via 145) of the interconnect 126. In some embodiments, the bottom area of the TIV 286 is 60 times to 17500 times the bottom area of a via (e.g. the via 145) of the interconnect 126, and the top area of the TIV 286 is 60 times to 17500 times the top area of a via (e.g. the via 175) of the interconnect 126. The volume of the TIV 286 is larger than the volume of a via of the interconnect 126. In some embodiments, the volume of the TIV 286 is 80000 times to 700000 times the volume of a via (e.g. the via 145) of the interconnect 126.

Referring to FIG. 1F, the cross-sectional shape of the barrier layer 282 is, for example, in a U-shape. In some embodiments, the barrier layer 282 of the TIV 286 surrounds only the sidewalls and the bottom surface of the conductive filling layer 284. The barrier layer 282 located on the sidewall 280a of the through interconnect via opening 280 is sandwiched between the dielectric layer 170, 160, 150 and 140 and the conductive filling layer 284. A bottom portion of the barrier layer 284 has a generally planar surface sandwiched between the conductive filling layer 284 and the conductive layer 236 and in physical contact with the bottom conductive layer 236. The cross-sectional shape of the barrier layer 282 located in the sidewall of the dielectric layer 170, 160, 150 and 140 is, for example, a continuously extending straight line or a curve. Herein, the straight line represents a line with no obvious turning point such as the barrier layer 142 in the trench 143 extending to the via opening 141 (shown in FIG. 1A). The straight line may be perpendicular to the surface 100a of the substrate 100. The straight line may also be an inclined line that is at an angle θ to the surface 100a of the substrate 100 (the angle ranges from 84 to 89 degrees, for example, 85 degrees, 86 degrees, 87 degrees, and 88 degrees. The cross-sectional shape of the barrier layer 282 located on the bottom conductive layer 236 is, for example, a continuously extending transverse line.

Referring to FIG. 1G, a top surface 284a of the conductive filling layer 284 is in physical contact with the pad 296, and a sidewall 284b and a bottom surface 284c of the conductive filling layer 284 are surrounded by the barrier layer 282. The conductive filling layer 284 is a block structure, and the conductive filling layer 284 is free from the barrier layer and the dielectric layer. In other words, no barrier layer nor dielectric layer is wrapped by the conductive filling layer 284. In some embodiments, from the bottom surface of the barrier layer 292 of the pad 296, extending down to the top surface of the bottom conductive layer 236, there is only a single barrier layer 282, and the conductive filling layer 284 of the through interconnect via 286 occupies most of the space. The volume of the conductive filling layer 284 is about 70% or more than the volume of the TIV 286, and the volume of the barrier layer 282 is about 20% or less than the volume of the TIV 286. For example, the volume of the conductive filling layer 284 is 70% to 80% of the volume of the TIV 286, while the volume of the barrier layer 282 is 30% to 20% of the volume of the TIV 286. In some embodiments, the volume of the conductive filling layer 284 is 3.5 times to 4 times the volume of the barrier layer 282.

Since the conductive filling layer 284 with a lower resistance value occupies most of the volume of the TIV 286, the resistance of the overall TIV 286 may be reduced.

FIGS. 2A to 2F are schematic cross-sectional views illustrating a manufacturing process of an integrated circuit device, in accordance with some embodiments of the disclosure.

Figure 2A:
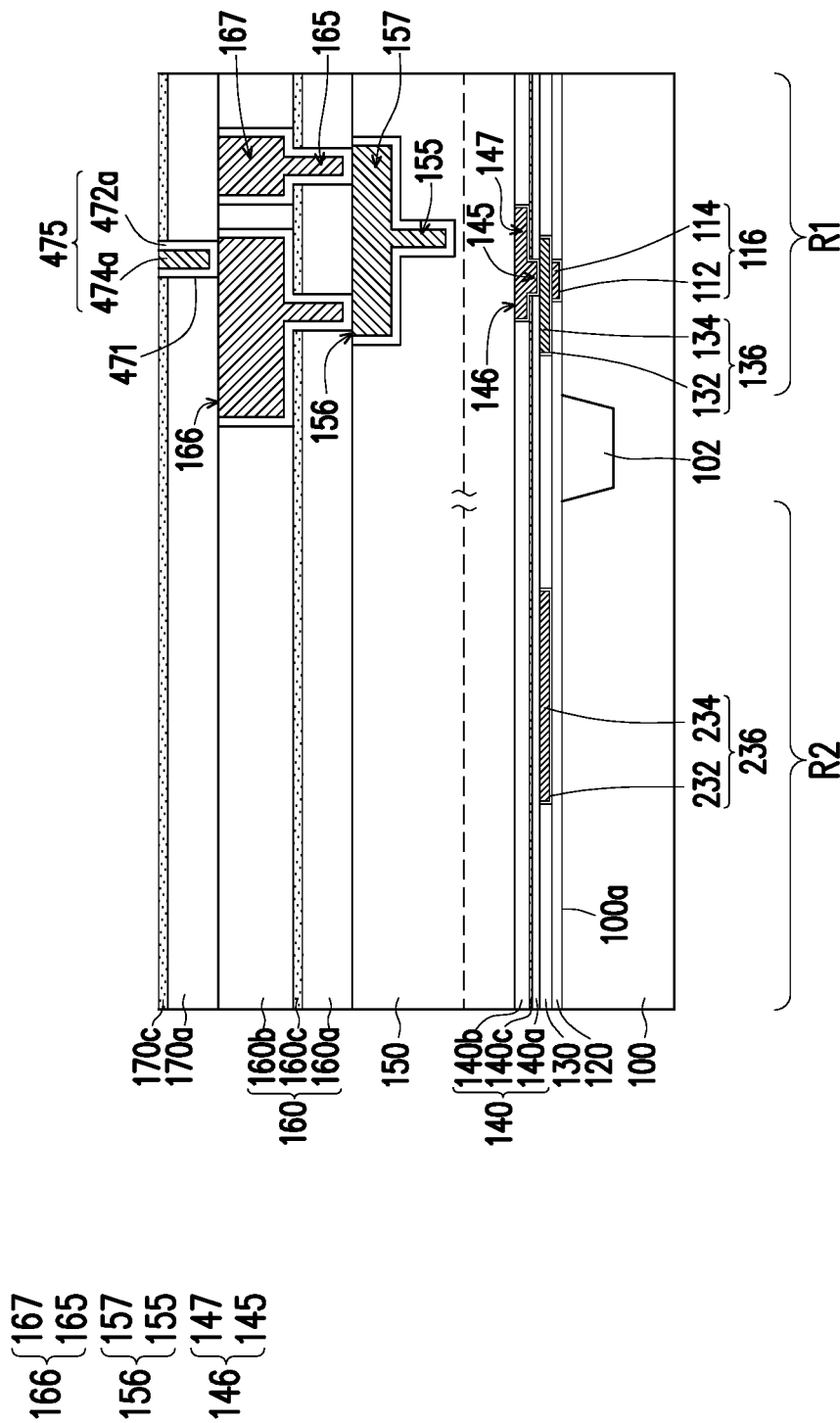
FIGS. 2A to 2F are schematic cross-sectional views illustrating a manufacturing process of an integrated circuit device, in accordance with alternate embodiments of the disclosure.
Figure 2B:
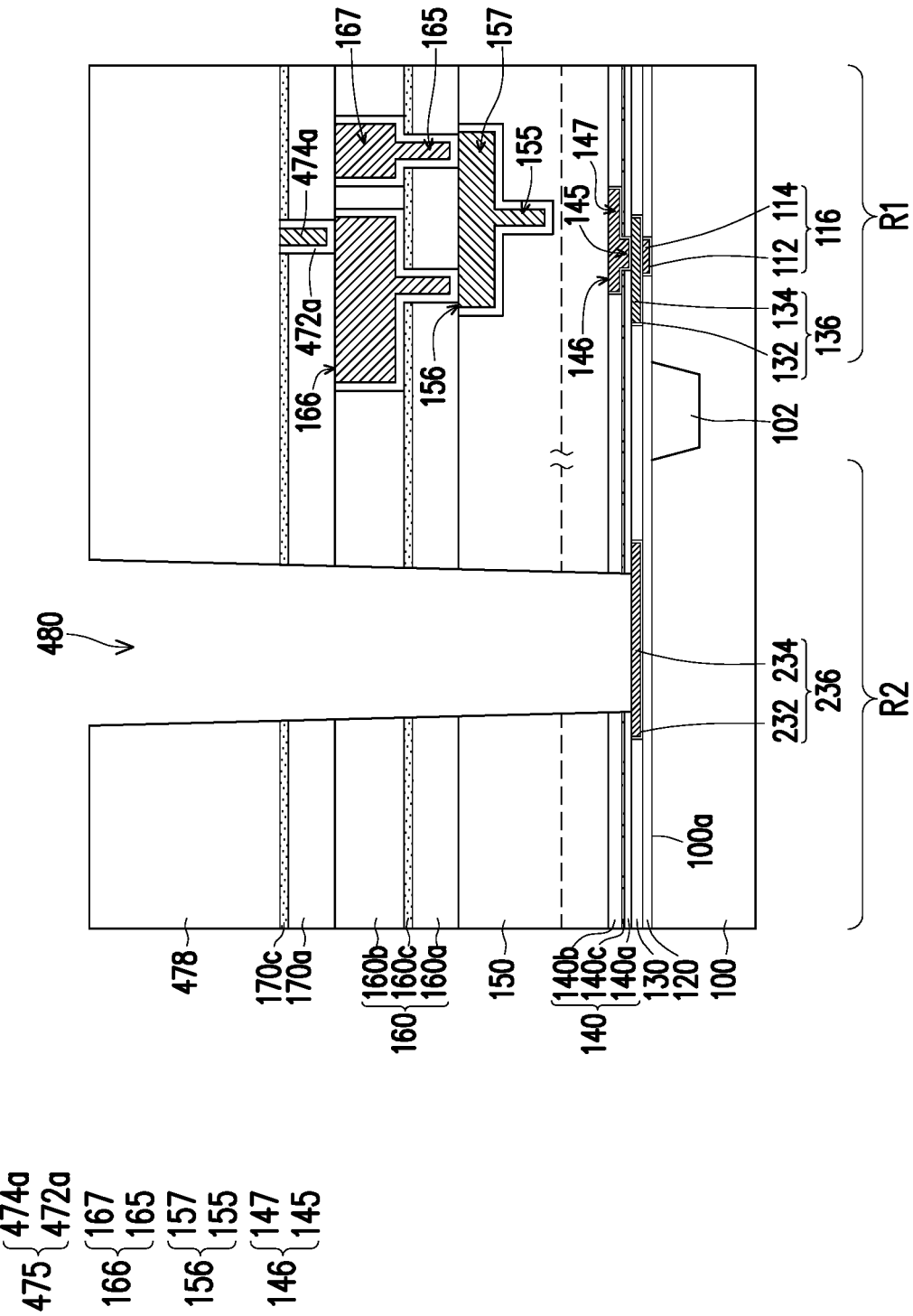
Figure 2C:
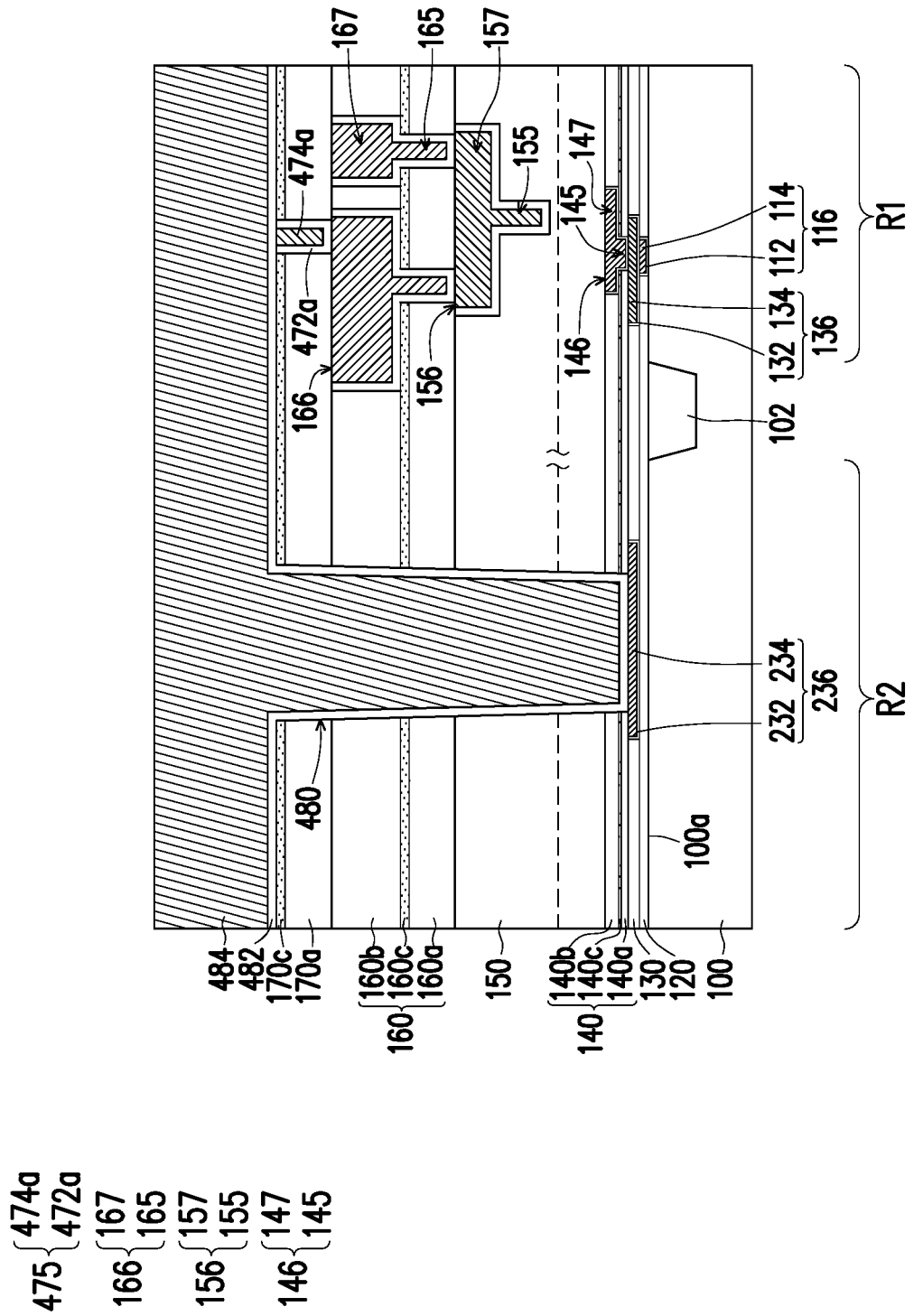
Figure 2D:
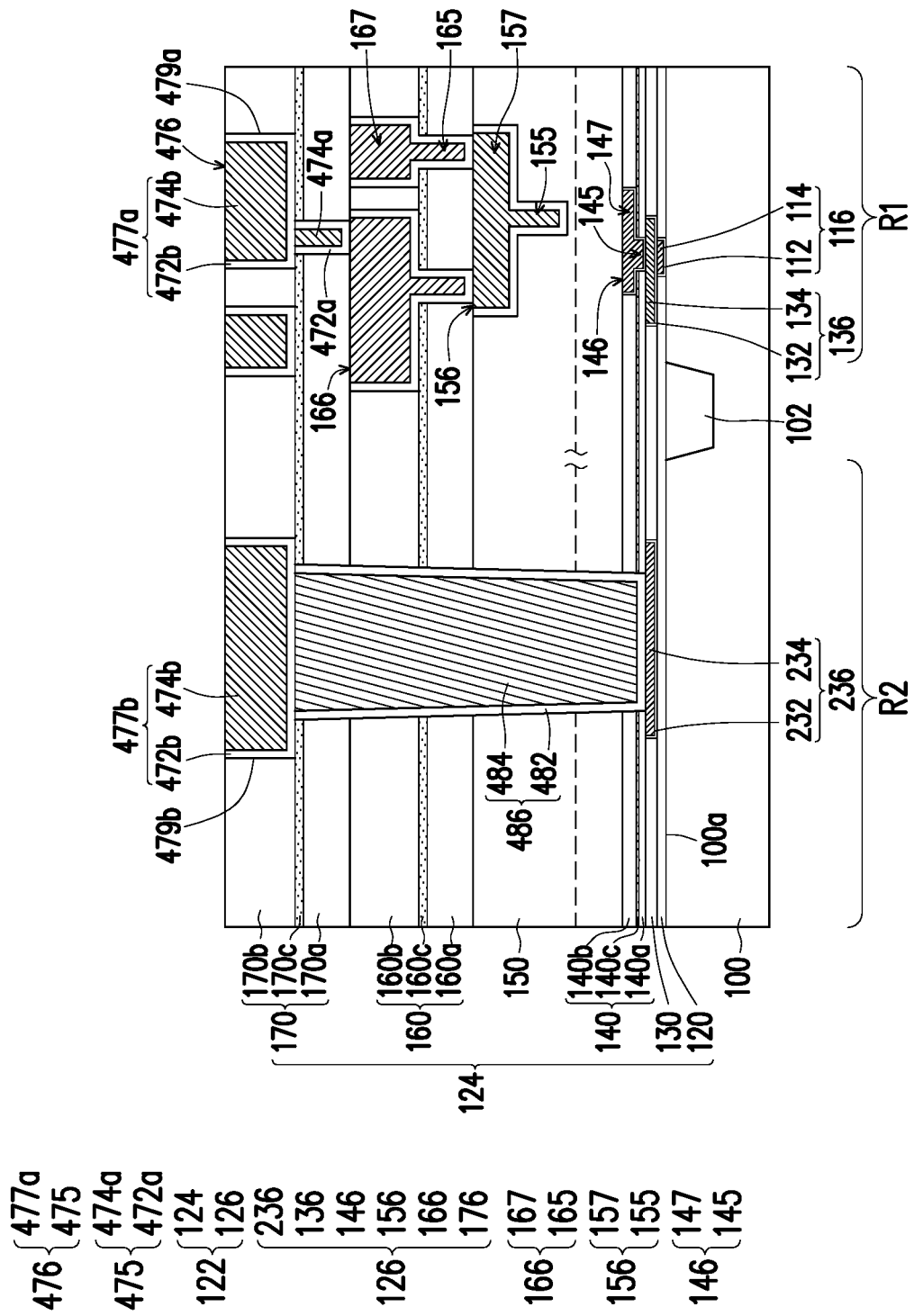
Figure 2E:
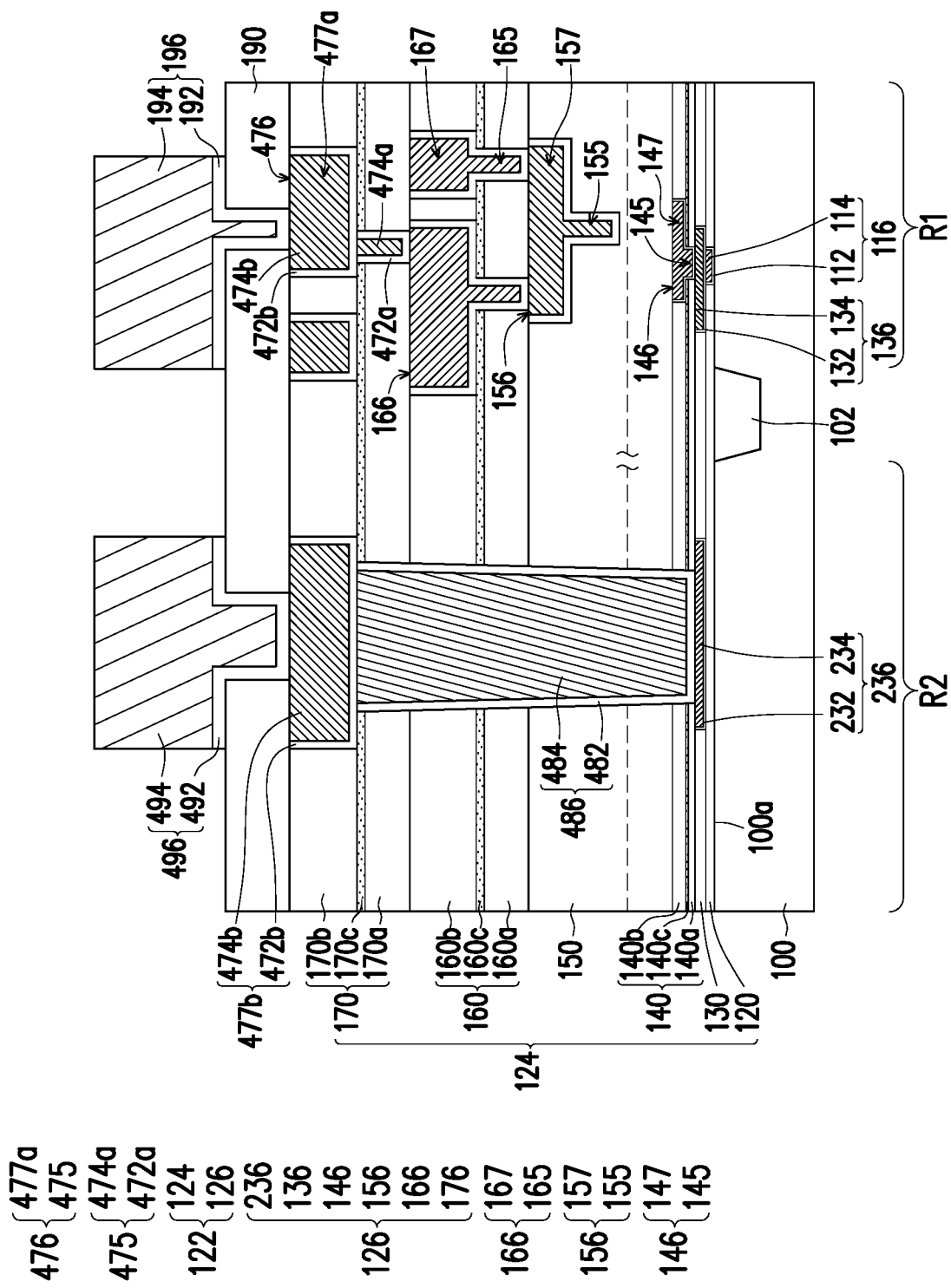
Figure 2F:
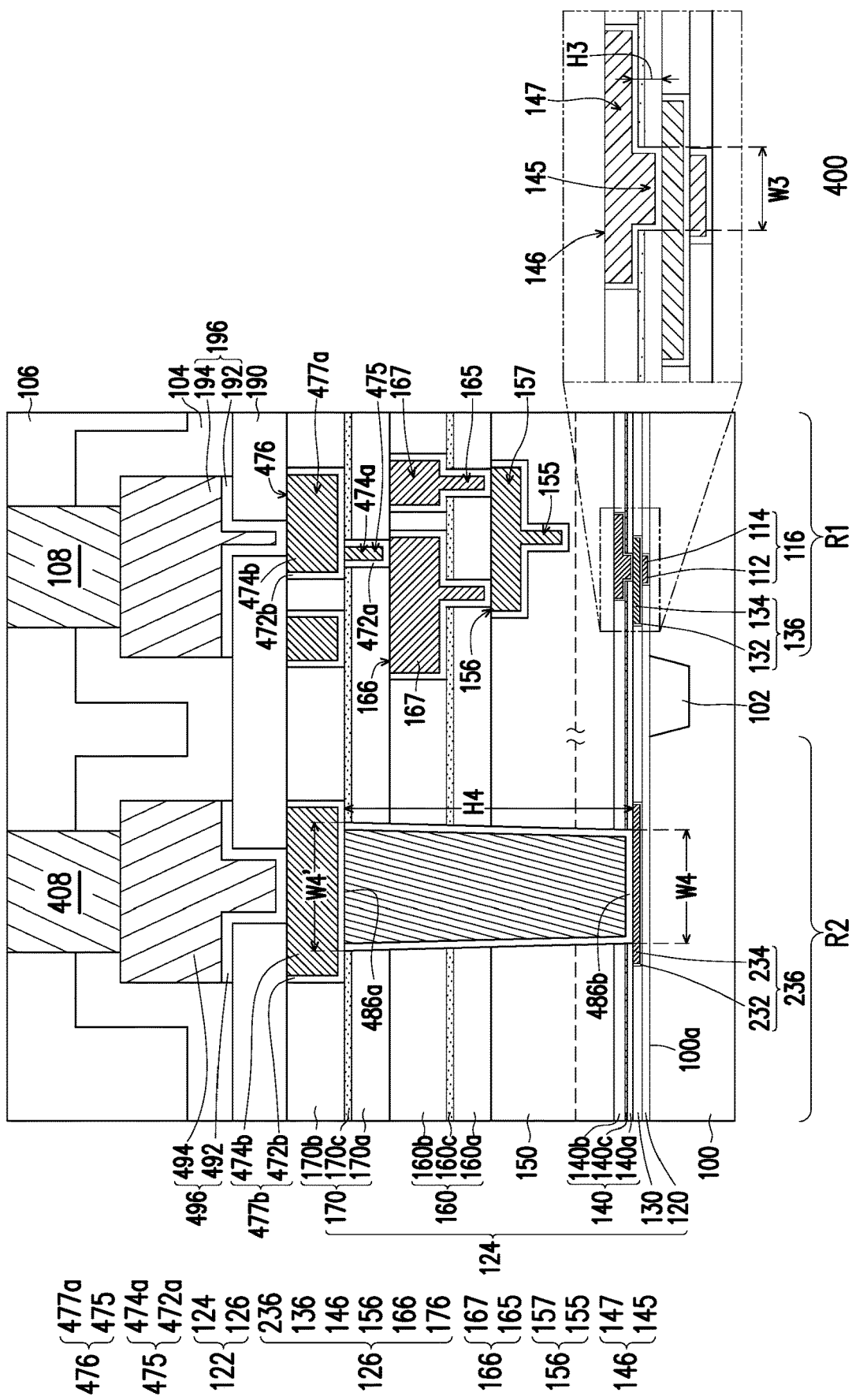

Referring to FIG. 2F, an integrated circuit device 400 is similar to the semiconductor device 200 of FIG. 1G, except that a TIV 486 of the integrated circuit device 400 is not in physical contact with a pad 496. A top conductive layer 477b is interposed between the TIV 486 and the pad 496. The following is a description of the steps after the conductive feature 166 is formed.

Referring to FIG. 2A, after the conductive feature 166 is formed in the dielectric layer 160, a dielectric material layer 170a and a dielectric material layer 170c are formed on the dielectric layer 160. The dielectric material layers 170b and 170c are patterned by lithography and etching processes so as to form a via opening 471. A barrier layer and a conductive material layer are formed on the dielectric layer 170c and filled in the via opening 471, and then the conductive material layer and the barrier material layer are planarized using a chemical mechanical polishing process (CMP) to form a barrier layer 472a and a conductive pattern 474a in the via opening 471. The barrier layer 472a and the conductive pattern 474a may be collectively referred to as a via 475.

Referring to FIG. 2B, a mask 478 is formed on the substrate 100. The mask layer 478 may be a patterned photoresist layer. An etching process is performed using the mask layer 478 as a mask to form a through interconnect via (TIV) opening 480 exposing the conductive layer 236. The etching process may be an anisotropic etch process. The anisotropic etching process may employ a dry etching process such as an RIE etching process. The etching process may use $CF_4$ and $SiF_4$ as etching gases, for example.

Referring to FIGS. 2B and 2C, the mask layer 478 is removed by stripping, for example. Thereafter, a barrier material layer 482 is formed over the substrate 100. The barrier material layer 482 covers the dielectric layer 170c and covers the sidewalls and bottom surface of the through interconnect via opening 480. Thereafter, a conductive fill material layer 484 is formed over the substrate 100. The conductive fill material layer 484 overlies the barrier material layer 482 on the dielectric layer 170a and fills the through interconnect via opening 480.

Referring to FIGS. 2C and 2D, a planarization process is performed to remove the conductive fill material layer 484 and the barrier material layer 482 on the dielectric layer 170a. The planarization process may be a chemical mechanical polishing process or an etch back process. The conductive filling layer 484 and the barrier layer 482 remaining in the through interconnect via opening 480 may be collectively referred to as a through interconnect via (TIV) 486.

Referring to FIG. 2D, a dielectric material layer 170b is formed over the substrate 100, and the dielectric material layer 170b is then patterned by lithography and etching processes so as to form trenches 479a and 479b. A barrier layer and a conductive material layer are formed on the dielectric layer 170b and filled in the trenches 479a and 479b, and then the conductive material layer and the barrier material layer are planarized using a chemical mechanical polishing process (CMP) to form a barrier layer 472b and a conductive pattern 474b in the trenches 479a and 479b. The barrier layer 472b and the conductive pattern 474b in the trench 479a may be collectively referred to as a conductive layer 477a. The barrier layer 472b and the conductive pattern 474b in the trench 479b may be collectively referred to as a conductive layer 477b. The conductive layer 477a and the via 475 may be collectively referred to as a conductive feature 476.

Referring to FIGS. 2E and 2F, a passivation layer 190, conductive pads 196 and 496, passivation layers 104 and 106, and connectors 108 and 408 are formed by using methods similar to the passivation layer 190, the conductive pads 196 and 296, the passivation layers 104 and 106, and the connectors 108 and 208 described above, respectively.

Referring to FIG. 2F, in some embodiments, the conductive layer 236 is connected to the contacts 216 of the MEOL conductive features and the TIV 486 of the BEOL conductive features. The TIV 486 is a BEOL conductive features that interconnect BEOL conductive features in different dielectric layer to one another, such as the conductive layer 236 to the topmost conductive layer 477b disposed in dielectric material layer 170b overlying the dielectric material layer 170c, thereby electrically and/or physically coupling BEOL conductive features of integrated circuit device 400. In other words, the TIV 486 is disposed between the top conductive layer 477b and the bottom conductive layer 236.

A top surface 486a of the TIV 486 may be coplanar with the top surfaces of the via 475 and the dielectric material layer 170c. A bottom surface 486b of the TIV 486 may be coplanar with the top surfaces of the conductive layers 236 and 136, and the top surface of the dielectric layer 130. The top surface 486a of the TIV 486 is in physical contact with the top conductive layer 477b, and the bottom surface 486b of the TIV 486 is in physical contact with the bottom conductive layer 236.

The top conductive layer 477b is at the same level as the top conductive layer 477a. In some embodiments, the top conductive layer 477b includes a conductive pattern 474b and a barrier layer 472b around the conductive pattern 474b. The conductive pattern 474b of the top conductive layer 477b is in physical contact with a barrier layer 492 of the pad 496 and the passivation layer 190. A conductive layer 494 of the pad 496 is in physical contact with connector 408.

The top surface 486a of the TIV 486 is covered by the barrier layer 472a of the top conductive layer 477a. The width of the top surface 486a of the TIV 486 may be less than or equal to the width of the bottom surface of the top conductive layer 477b, but the disclosure is not limited thereto. The TIV 486 penetrates the multilayer dielectric layers. In some embodiment, the TIV 486 extends through the dielectric layers 170 (e.g. 170c, 170a), 160 (e.g. 160b, 160c, 160a), 150, and into the dielectric layer 140 (e.g. 140b, 140c, 140a). A height H4 of the TIV 486 is, for example, 4000 angstroms to 35000 angstroms. A top width W4' of the TIV 486 ranges, for example, from 2 μm to 15 μm. The aspect ratio of the TIV 486 may range from 1 to 2, for example, 1.3. The width of the aspect ratio refers to the top width W4' of the TIV 486, and the height of the aspect ratio refers to the height H4 measured from the top end to the bottom end of the TIV 486.

The bottom width W4 of the TIV 486 is greater than the bottom width of one of the vias 145, 155, 165, 475. In some embodiments, the bottom width W4 of the TIV 486 is 40 times to 75 times the bottom width W3 of a via (e.g. via 145) of the interconnect 126. The height H4 of the TIV 486 is greater than the height of one of the vias 145, 155, 165, 475 of the interconnect 126, where the H4 of the TIV 486 is measured from the top end to the bottom end of the TIV 486.

In some embodiments, the height H4 of the TIV 486 is 5 times to 40 times the height H3 of a via (e.g. via 145) of the interconnect 126. The cross-sectional area of the TIV 486 is greater than the cross-sectional area of a via of the interconnect 126 at the same level. The bottom area of the TIV 486 is 60 times to 17500 times the bottom area of a via (e.g. the via 145) at the same level, for example.

The conductive filling layer 484 is a block structure, and the conductive filling layer 484 is free from the barrier layer and the dielectric layer. In other words, no barrier layer nor dielectric layer is wrapped by the conductive filling layer 484. In some embodiments, the volume of the conductive filling layer 484 is 3.7 times to 4 times the volume of the barrier layer 482.

The cross-section of the barrier layer 482 is, for example, a U-shape. In some embodiments, the barrier layer 482 of the TIV 486 only surrounds the sidewalls and bottom surface of the conductive filling layer 484. The barrier layer 482 at the sidewalls of the conductive filling layer 484 is sandwiched between the sidewalls of the dielectric layers 170, 160, 150, 140 and the conductive filling layer 484. The barrier layer 482 located under the bottom surface the conductive filling layer 484 is sandwiched between and in physical contact with the conductive filling layer 484 and the bottom conductive layer 236.

The volume of the conductive filling layer 484 of the TIV 486 is 77% or more of the volume of the TIV 486, and the volume of the barrier layer 482 of the TIV 486 is 23% or less of the volume of the TIV 486. For example, the volume of the conductive filling layer 484 of the TIV 486 is 77% to 80% of the volume of the TIV 486, and the volume of the barrier layer 482 of the TIV 486 is 23% to 20% of the volume of the TIV 486. Since the conductive filling layer 484, which has a lower resistance value in the TIV 486, occupies most of the volume of the TIV 486, the resistance of the overall TIV 486 may be reduced.

FIGS. 3A to 3F are schematic cross-sectional views illustrating a manufacturing process of an integrated circuit device, in accordance with some embodiments of the disclosure.

Figure 3A:
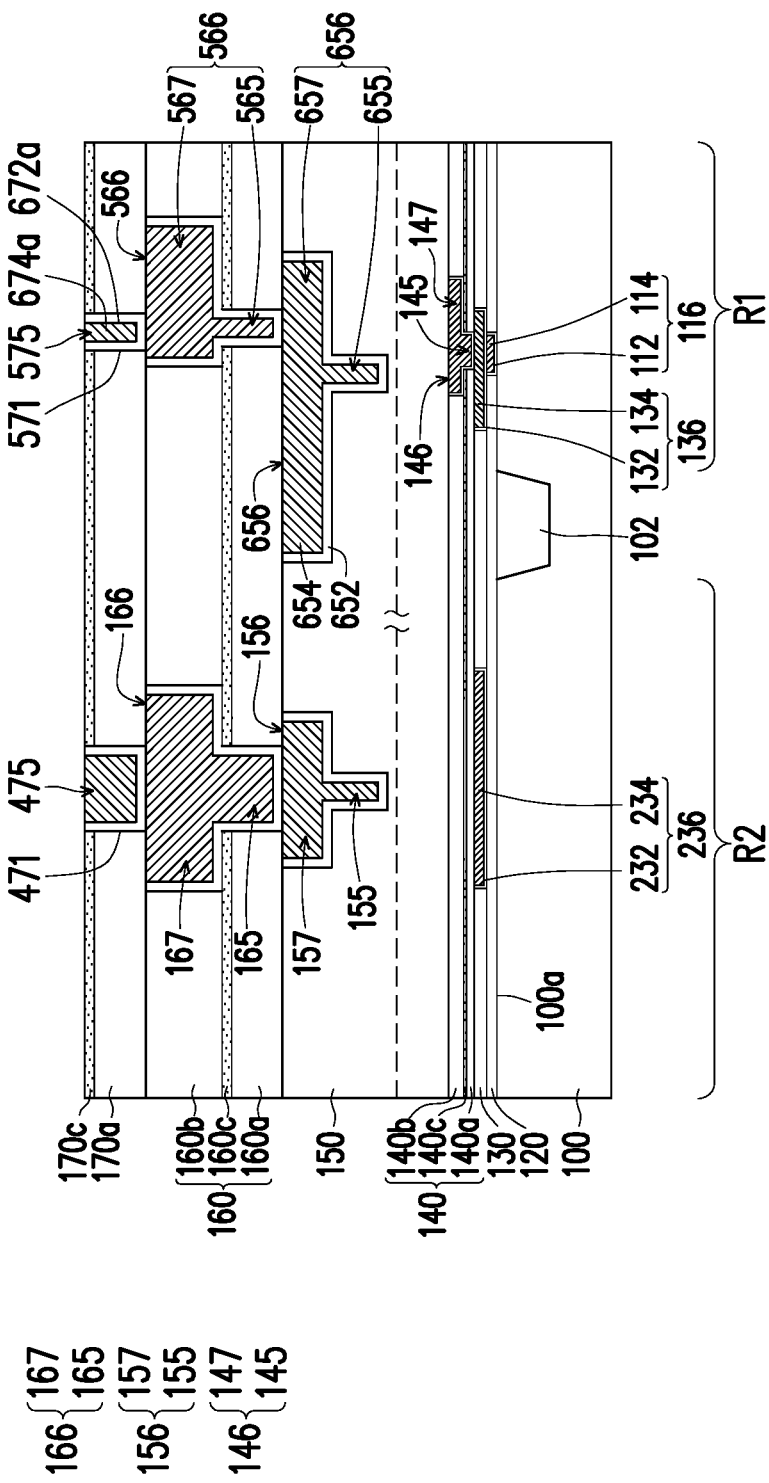
FIGS. 3A to 3F are schematic cross-sectional views illustrating a manufacturing process of an integrated circuit device, in accordance with alternate embodiments of the disclosure.
Figure 3B:
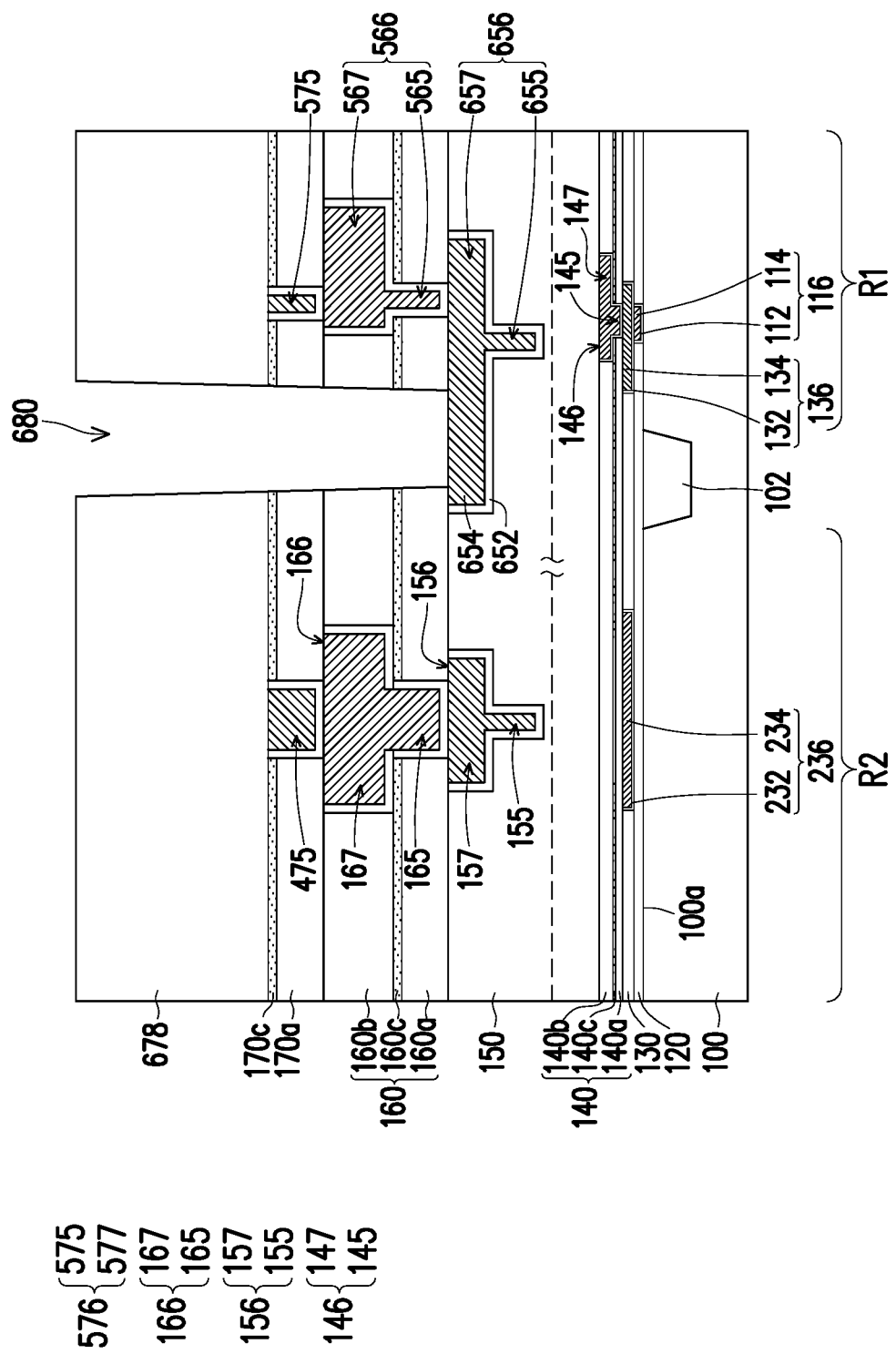
Figure 3C:
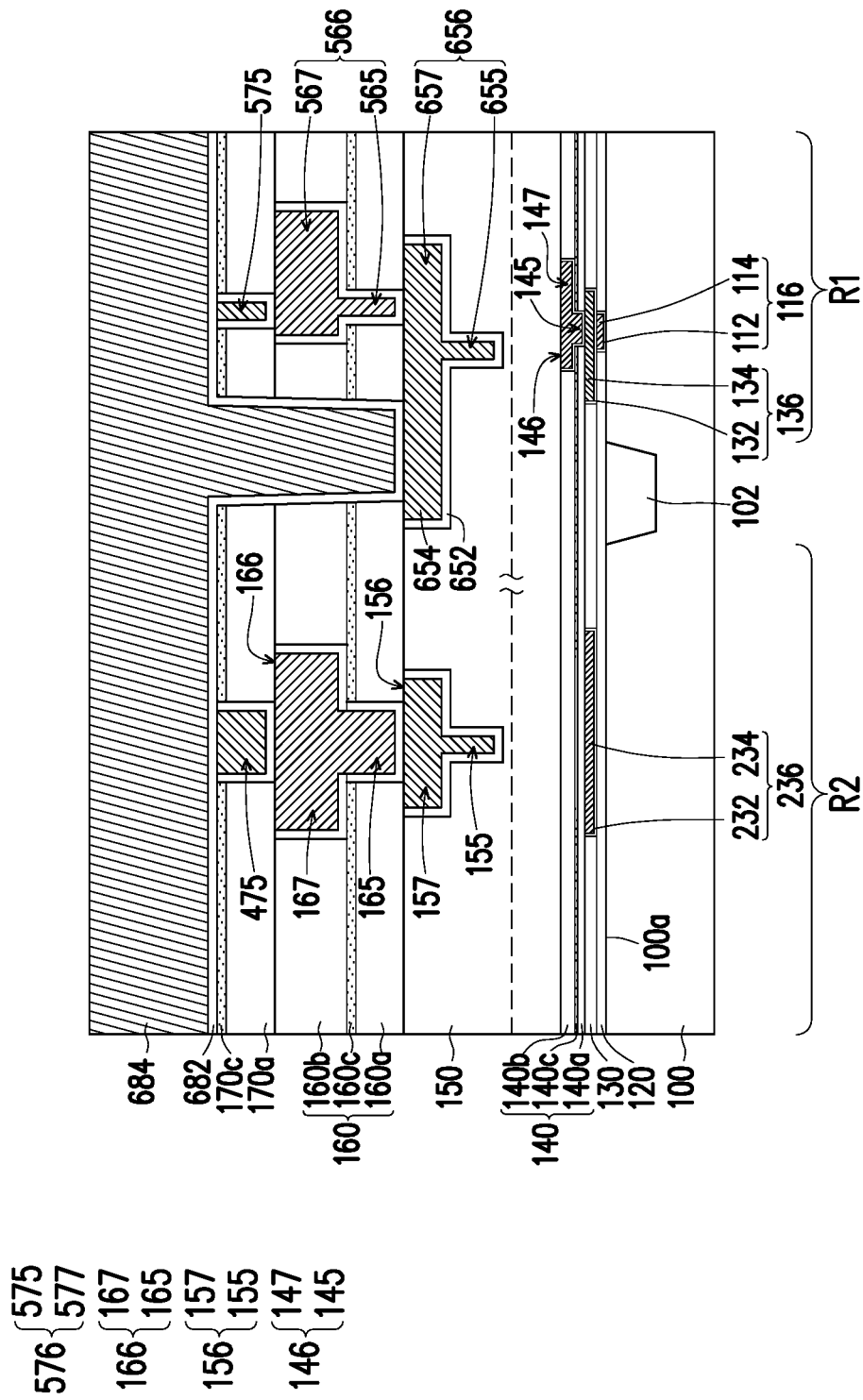
Figure 3D:
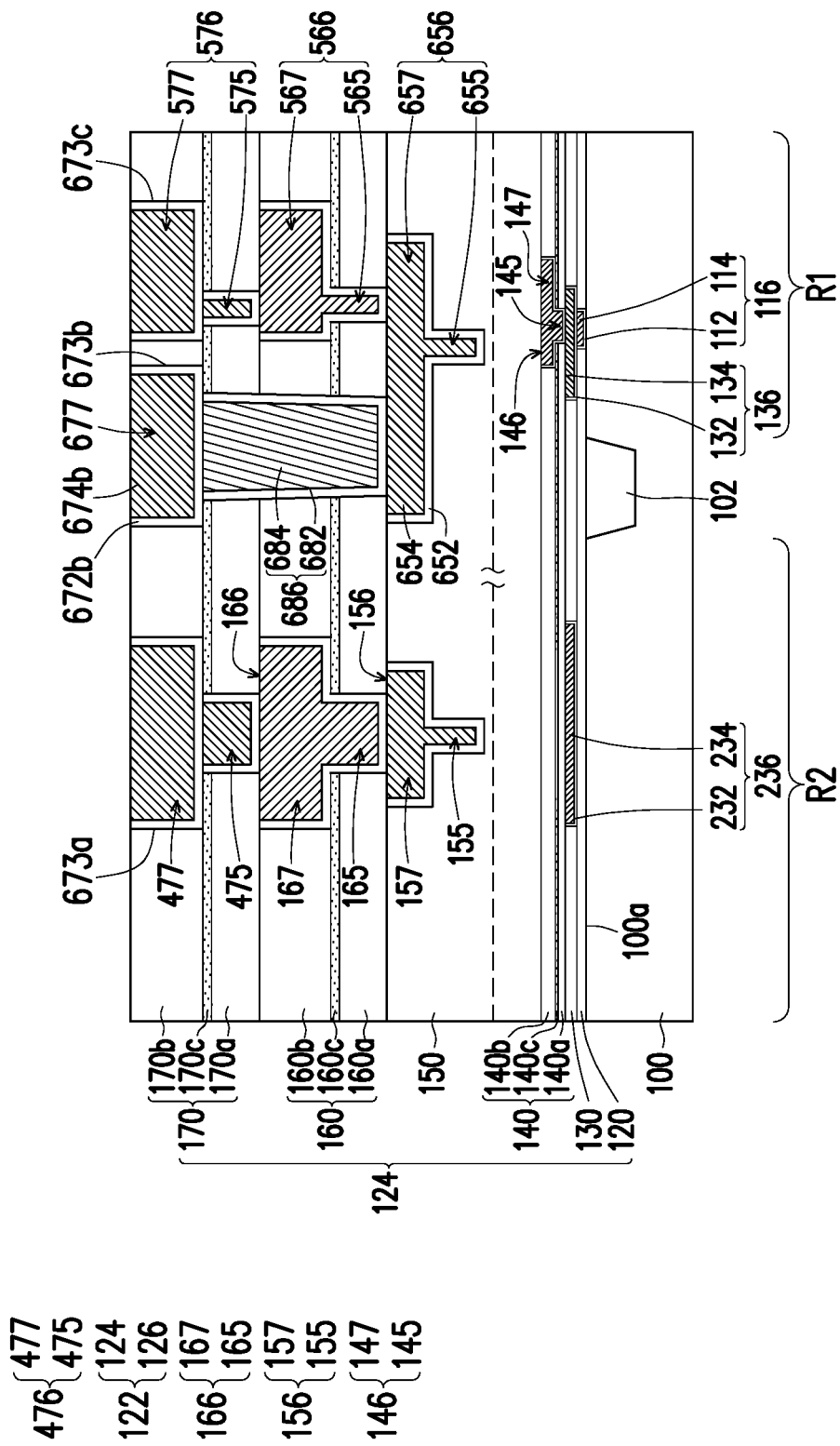
Figure 3E:
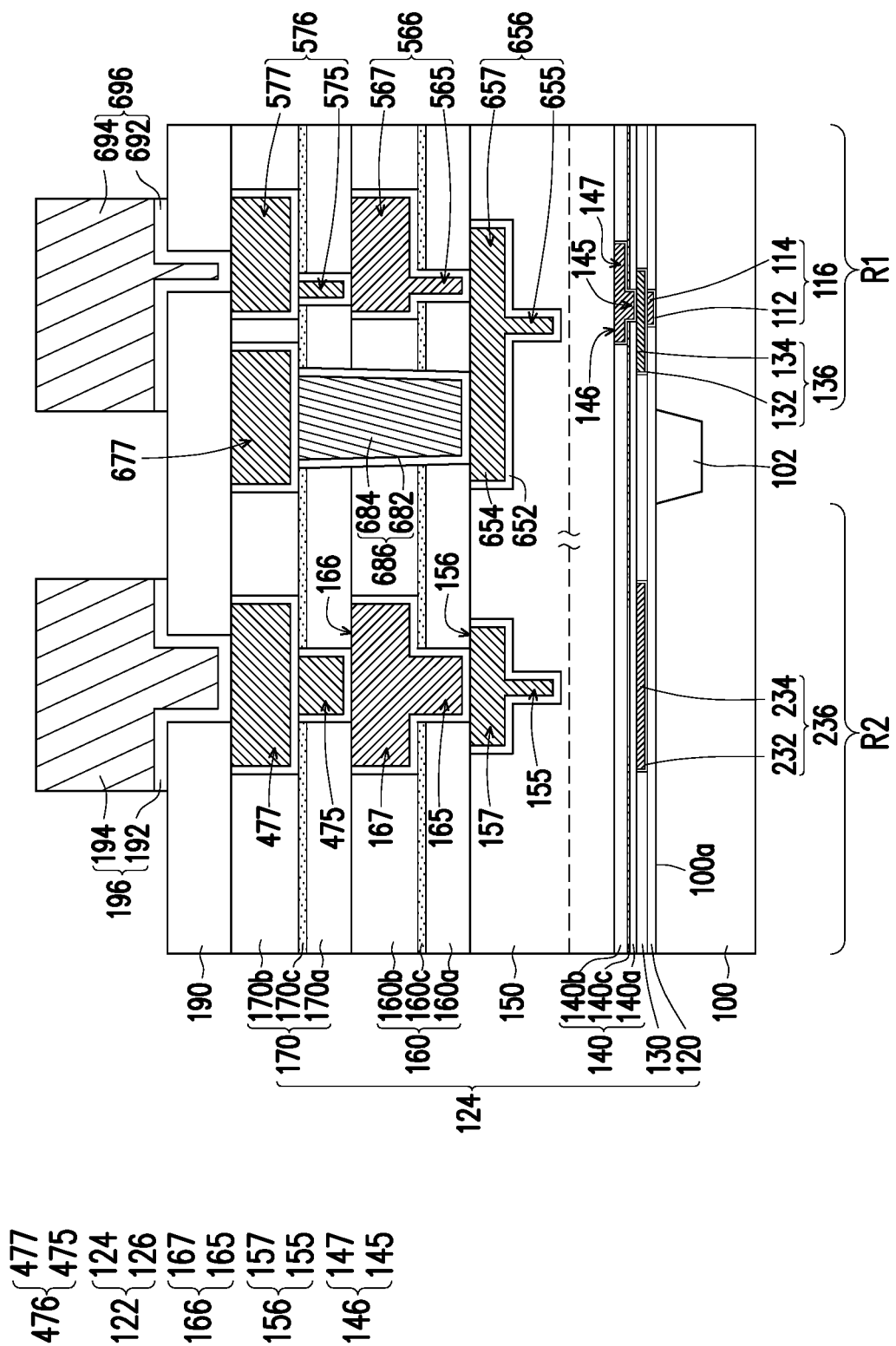
Figure 3F:
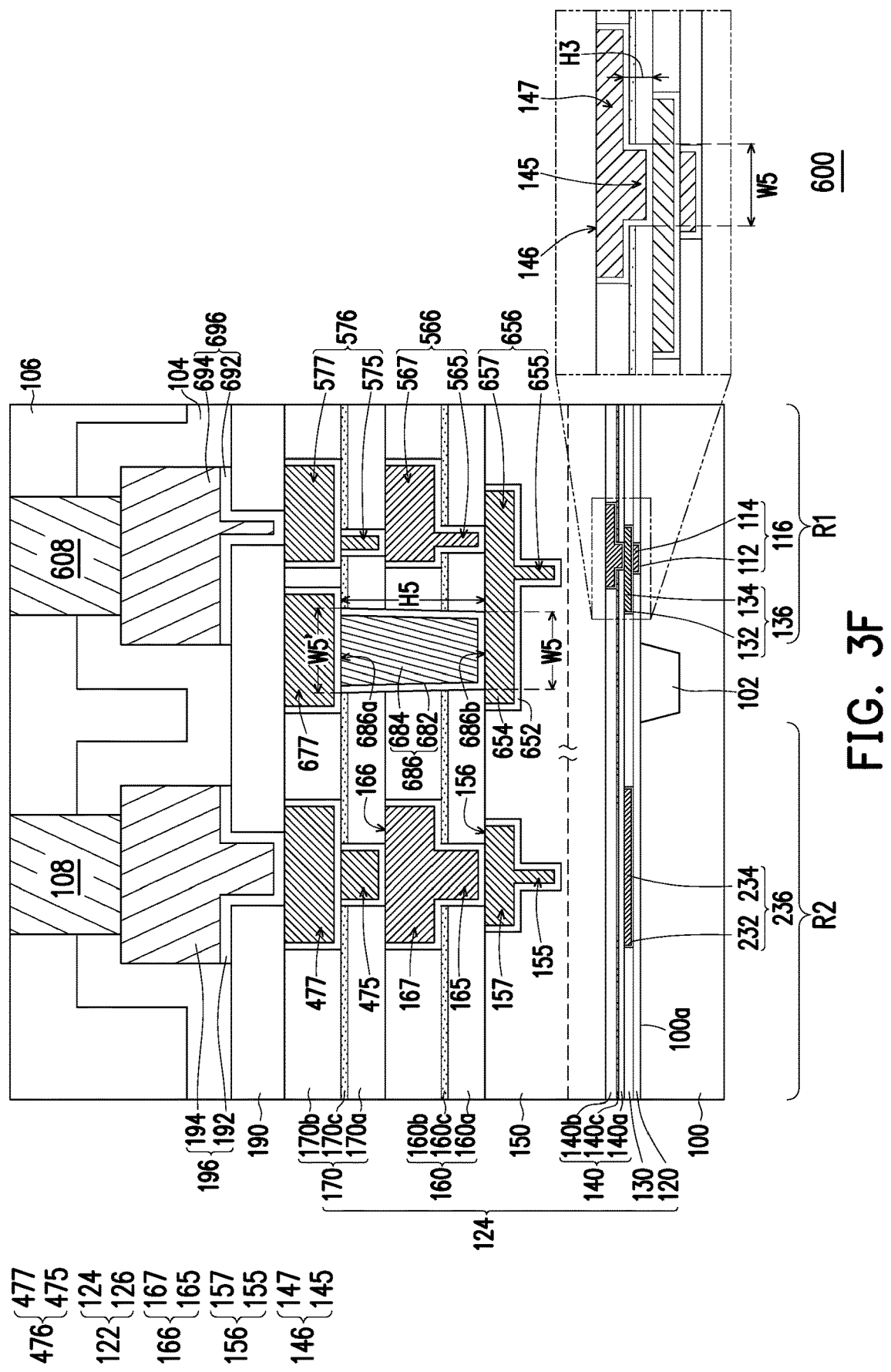

Referring to FIG. 3F, an integrated circuit device 600 is similar to the integrated circuit device 400 of FIG. 2F, except that a TIV 686 of the integrated circuit device 600 is in physical contact with a conductive layer 667, and a top conductive layer 677 is not in physical contact with a connector 696.

Referring to FIG. 3A, the dielectric layers 150 and 160 are formed over the substrate 100. The dielectric layer 150 has conductive features 156 and 656 formed therein. In some embodiments, the conductive features 156 and 656 may be formed at the same time. The conductive feature 156 includes the via 155 and the conductive layer 157 over the via 155. The via 155 interconnects the conductive layer 157 to the conductive layer 236 through a conductive layer of a conductive feature (not shown) formed in the dielectric layer 140. The conductive feature 656 includes a via 655 and a conductive layer 657 over the via 655. The via 655 interconnects the conductive layer 657 to the conductive layer 136. The dielectric layer 160 has conductive features 166 and 566 formed therein. In some embodiments, the conductive features 156 and 656 may be formed at the same time. The conductive feature 166 includes the via 165 and the conductive layer 167 over the via 165. The via 165 interconnects the conductive layer 167 to the conductive layer 157. The conductive feature 566 includes a via 565 and a conductive layer 567 over the via 565. The via 565 interconnects the conductive layer 567 to the conductive layer 657. In some embodiments, the conductive layer 136, the conductive features 146, 656, 566 are formed in a first region R1 of the substrate 100; the conductive layer 236, the conductive features 156, 166 are formed in a first region R2 of the substrate 100. In some embodiments, the first region R1 is a core region, or a SRAM region; and the second region R2 is an IO region.

After the dielectric material layers 170a and 170c are formed over the substrate 100, the dielectric material layers 170b and 170a are patterned by lithography and etching processes so as to form via openings 471 and 571. A barrier layer and a conductive material layer are formed on the dielectric layer 170c and filled in the via openings 471 and 571, and then the conductive material layer and the barrier material layer are planarized using a chemical mechanical polishing process (CMP) to form a barrier layer 672a and a conductive pattern 674a in the via openings 471 and 571. The barrier layer 472a and the conductive pattern 474a in the via opening 471 may be collectively referred to as a via 475. The barrier layer 672a and the conductive pattern 674a in the via opening 571 may be collectively referred to as a via 575.

Referring to FIG. 3B, a mask 678 is formed on the substrate 100. The mask layer 678 may be a patterned photoresist layer. An etching process is performed using the mask layer 678 as a mask to form a through interconnect via (TIV) opening 680. The etching process may be an anisotropic etching process. The anisotropic etching process may employ a dry etching process such as an RIE etching process. The through interconnect via opening 680 exposes the conductive layer 657 formed in the dielectric layer 150.

Referring to FIGS. 3B and 3C, the mask layer 678 is removed by stripping, for example. Thereafter, a barrier material layer 682 and a conductive fill material layer 684 are formed over the substrate 100 and filled in the through interconnect via opening 680.

Referring to FIGS. 3C and 3D, a planarization process is performed to remove the conductive fill material layer 684 and the barrier material layer 682 on the dielectric layer 170c. The planarization process may be a chemical mechanical polishing process or an etch back process. The conductive filling layer 684 and the barrier layer 682 remaining in the through interconnect via opening 680 may be collectively referred to as through interconnect via (TIV) 686.

Referring to FIG. 3D, a dielectric material layer 170b is formed over the substrate 100, and the dielectric material layer 170b is then patterned by lithography and etching processes so as to form trenches 673a, 673b and 673c. A barrier layer and a conductive material layer are formed on the dielectric layer 170c and filled in the trenches 673a, 673b and 673c. Thereafter, the conductive material layer and the barrier material layer are planarized using a chemical mechanical polishing process (CMP) to form a barrier layer 672b and a conductive pattern 674b in the trenches 673a, 673b and 673c. The barrier layer 672b and the conductive pattern 674b formed in the trench 673a may be collectively referred to as a conductive layer 477. The barrier layer 672b and the conductive pattern 674b formed in the trench 673b may collectively referred to as a conductive layer 677. The barrier layer 672b and the conductive pattern 674b in the trench 673c may be collectively referred to as a conductive layer 577. The conductive layer 477 and the via 475 may be collectively referred to as a conductive feature 476. The conductive layer 577 and the via 575 may be collectively referred to as a conductive feature 576.

Referring to FIGS. 3E and 3F, a passivation layer 190, conductive pads 196, 696, passivation layers 104 and 106, and connectors 108 and 608 are formed by using methods similar to the passivation layer 190, conductive pads 196 and 496, passivation layers 104 and 106, and connectors 108 and 408 described above, respectively.

Referring to FIG. 3F, in some embodiments, the conductive layer 657 is connected to the vis 655 of the BEOL conductive features and the TIV 686 of the BEOL conductive features. The TIV 686 is a BEOL conductive feature that interconnect BEOL conductive features in different dielectric (material) layer to one another, such as the conductive layer 657 to the topmost conductive layer 677 disposed in dielectric material layer 170b overlying the dielectric material layer 170c, thereby electrically and/or physically coupling BEOL conductive features of integrated circuit device 600. A top surface 686a of the TIV 686 may be coplanar with the top surfaces of the vias 475, 575 and the dielectric material layer 170b. A bottom surface 686b of the TIV 686 may be coplanar with the top surfaces of the conductive layers 657 and 157 and the top surface of the dielectric layer 150. The top surface 686a of the TIV 686 is in physical contact with the top conductive layer 677, and the bottom surface 686b of the TIV 686 is in physical contact with the conductive layer 657 of the conductive feature 656. The conductive layer 657 may be a conductive layer between the top conductive layers 477, 577 and 677 and the bottom conductive layers 136 and 236 of the interconnect 126. The conductive layer 657 includes a barrier layer 652 and a conductive pattern 654.

The TIV 686 is disposed between the top conductive layer 677 and the conductive layer 657. In some embodiments, the top conductive layer 677, which is directly over the TIV 686, is not in physical contact with the pads 196 or 696. The barrier layer 692 of the pad 696 is in physical contact with a top conductive layer 577. In some embodiments, the top conductive layer 677 may be electrically connected to the top conductive layer 577 at the same level, such that the TIV 686 may be electrically connected to the pads 696 through the top conductive layers 677 and 577. In alternate embodiments, the TIV 686 may be electrically connected to the pads 696 through the conductive layer 657, the via 565 and the conductive layer 567 of the conductive features 566, and the via 575 and the top conductive layer 577 of the conductive features 576. A conductive layer 694 of the pad 696 is connected to the connector 608. However, the disclosure is not limited thereto. In other some embodiments, the top conductive layer 677, which is directly over the via 686, may be in physical contact with a pad (not shown).

In some embodiments, the TIV 686 extends form the dielectric material layer 170c of the dielectric layer 170 to the dielectric material layer 160a of the dielectric layer 160. A height H5 of the TIV 686 is, for example, 5 to 10. The height H5 of the TIV 686 is measured from the bottom end to the top end of the TIV 686. A top width W5' of the TIV 686 ranges from 2 μm to 15 μm, and a bottom width W5 of the TIV 686 ranges from 1.5 um to 15 um, for example. The aspect ratio of the TIV 686 ranges from 1 to 2, for example, 1. The width of the aspect ratio refers to the top width W5' of the TIV 686, and the height of the aspect ratio refers to the height H5 of the TIV 686. In some embodiments, the height H5 of the TIV 686 is the same as the sum of the heights of the via 475, the conductive layer 167, and the via 165. In other words, the height H5 of the TIV 686 is greater than the sum of the heights of the vias 475 and via 165.

The conductive filling layer 684 is a block structure, and the conductive filling layer 684 is free from a barrier layer and a dielectric layer. In other words, no barrier layer nor dielectric layer is wrapped by the conductive filling layer 684. In some embodiments, the volume of the conductive filling layer 684 is about 3.5 times the volume of the barrier layer 682.

The cross-sectional area of the TIV 686 may be greater than the cross-sectional areas of the vias 475, 575 and 165, 565 at the same level. In some embodiments, the vias 165 and 475 are vias having the largest dimension in the dielectric layers 160 and 170, respectively. The bottom area of the TIV 686 is greater than the bottom area of the via 165, and greater than the bottom area of the bottom via 145. In some embodiments, the bottom area of the TIV 686 is about 17500 times the bottom area of the via 145. The top area of the TIV 686 is greater than the top area of the via 475. In some embodiments, the top area of the TIV 686 is about 60 times the top area of the top via 475.

Figure 4:
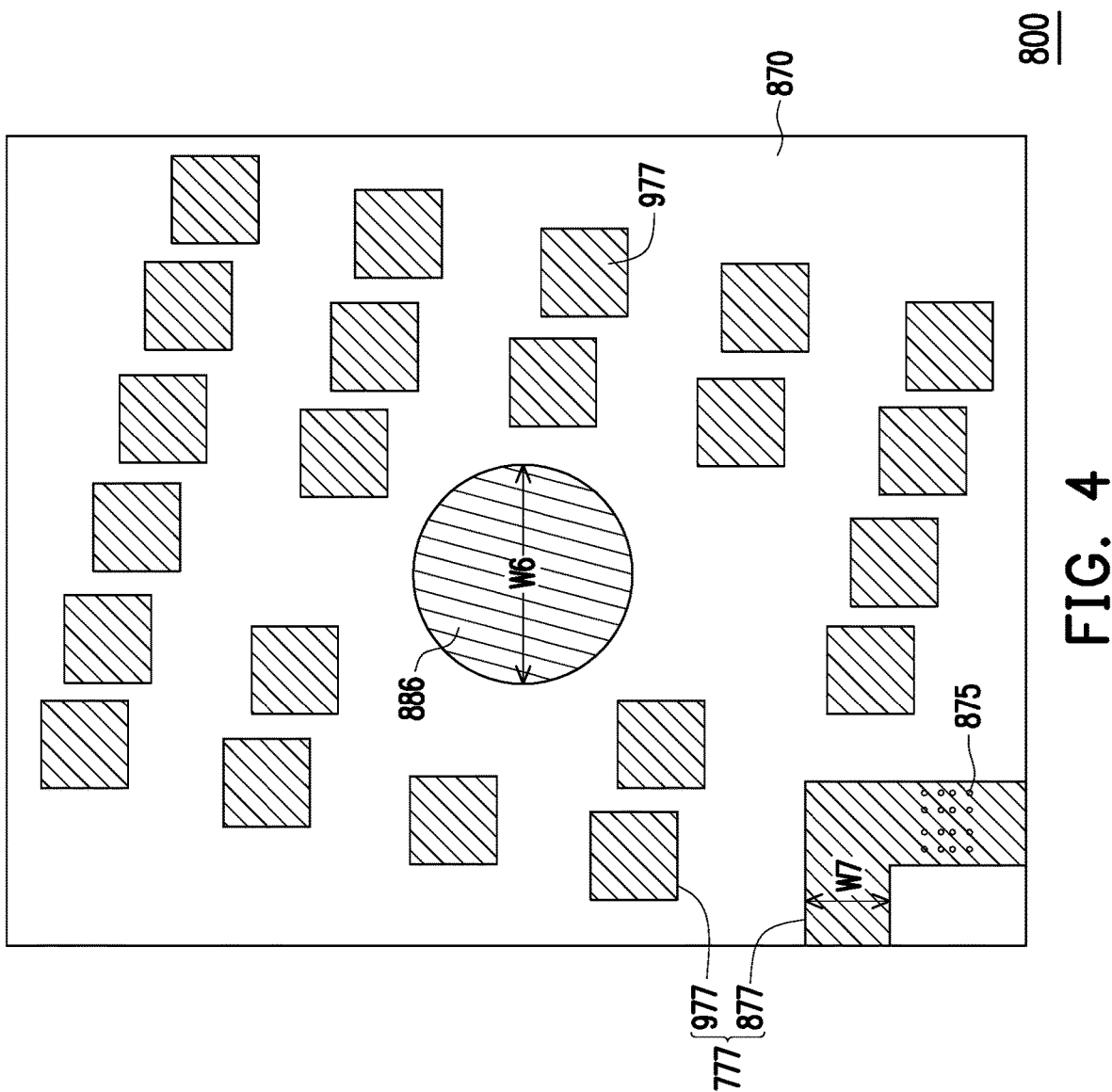
FIG. 4 is a top view illustrating an integrated circuit device, in accordance with some embodiments of the disclosure.

FIG. 4 is a top view illustrating an integrated circuit device having a TIV, in accordance with some embodiments of the disclosure.

Referring to FIG. 4, a through interconnect via 886 and a conductive layer 777 of are formed at a same level of an integrated circuit device 800. The through interconnect via 886 may be the through interconnect via 286, and the conductive layer 777 may be the top conductive layer 177 (shown in FIG. 1G). The conductive layer 777 may include dummy conductive layers 977 and a routing 877.

The dummy conductive layers 977 may be disposed around the through interconnect via 886 and/or the routing 877. The dummy conductive layers 977 may be not connected to other conductive layers, vias, or not electrically connected to an external circuit. The shape of the through interconnect via 886 may be circular, elliptical, square or rectangular, and the shape of the dummy conductive layers 977 may be square or rectangular, but the disclose is not limited thereto. In some embodiments, the top area of the through interconnect via 886 is greater than the top area of the dummy conductive layers 977.

The routing 877 is in physical contact with vias 875 under the routing 877. In some embodiments, a top width W6 (diameter) of the through interconnect via 886 is larger than a top width W7 of the routing 877. The through interconnect via 886 is grater than the via 875 under the routing 877. The top area of the through interconnect via 886 is 5 times to 17500 times the top area of the via 875, for example.

By forming a large interconnective via penetrating the multilayer dielectric layer, the interface barrier layer may be reduced. The contact resistance is greatly reduced, and the performance (low IR) of the signal transmission is improved. In some embodiments, the contact resistance of the through interconnect via may be reduced to 13 mOhm or less.

In accordance with some embodiments of the present disclosure, an integrated circuit device comprises a substrate; an interconnect structure on the substrate, wherein the interconnect structure comprises a plurality of dielectric layers and an interconnect in the plurality of dielectric layers; a passivation layer on the interconnect structure; a plurality of conductive pads on the passivation layer, comprising a first conductive pad electrically connecting the interconnect; and a through interconnect via (TIV) extending through the plurality of dielectric layers and electrically connecting a first conductive layer of the interconnect.

In accordance with alternate embodiments of the present disclosure, an integrated circuit device comprises a substrate; a dielectric structure on the substrate; an interconnect located in the dielectric structure; a conductive pad on the dielectric structure and electrically connecting the interconnect; and a through interconnect via penetrating through a first dielectric layer of the dielectric structure and extending upward into a second dielectric layer on the first dielectric layer of the dielectric structure.

In accordance with other alternate embodiments of the present disclosure, a method of fabricating an integrated circuit device comprises the following steps. A dielectric structure is formed on a substrate. The dielectric structure comprises a first dielectric layer on the substrate; and a second dielectric layer on the first dielectric layer. An interconnect is formed in the dielectric structure. The interconnect comprises a plurality of conductive layers and a plurality of vias between the plurality of conductive layers. A through interconnect via opening is formed in the dielectric structure. The through interconnect via opening at least extends from the first dielectric layer to the second dielectric layer. A through interconnect via (TIV) is formed in the through interconnect via opening. A passivation layer is formed on the dielectric structure. A plurality of conductive pads is formed on the passivation layer, electrically connecting the TIV and the interconnect, respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device, comprising:
a substrate;
an interconnect structure on a top surface of the substrate, wherein the interconnect structure comprises a plurality of dielectric layers and an interconnect in the plurality of dielectric layers;
a passivation layer on the interconnect structure;
a plurality of conductive pads on the passivation layer, comprising a first conductive pad electrically connecting the interconnect; and
a through interconnect via (TIV) extending through the plurality of dielectric layers and electrically connecting a first conductive layer of the interconnect, wherein a bottom surface of the through interconnect via is higher than the top surface of the substrate.

2. The integrated circuit device of claim 1, wherein the top surface of the through interconnect via is in physical contact with a second conductive pad of the plurality of conductive pads.

3. The integrated circuit device of claim 1, wherein the top surface of the through interconnect via is in physical contact with a top conductive layer of the interconnect.

4. The integrated circuit device of claim 3, wherein the top conductive layer of the interconnect is in physical contact with a second pad of the plurality of conductive pads.

5. The integrated circuit device of claim 3, wherein the top conductive layer of the interconnect is covered with the passivation layer.

6. The integrated circuit device of claim 5, wherein the top conductive layer of the interconnect electrically connects the first conductive pad through the interconnect.

7. The integrated circuit device of claim 1, wherein a bottom surface of the TIV is in physical contact with the first conductive layer, and the first conductive layer is a conductive layer between a top conductive layer and a bottom conductive layer of the interconnect.

8. The integrated circuit device of claim 1, wherein a bottom surface of the through interconnect via is in physical contact with the first conductive layer, and the first conductive layer is a bottommost conductive line of the interconnect.

9. An integrated circuit device, comprising:
a substrate;
a dielectric structure on a top surface of the substrate;
an interconnect located in the dielectric structure;
a conductive pad on the dielectric structure and electrically connecting the interconnect; and
a through interconnect via penetrating through a first dielectric layer of the dielectric structure and extending upward into a second dielectric layer over the first dielectric layer of the dielectric structure, wherein a bottom surface of the through interconnect via is higher than the top surface of the substrate.

10. The integrated circuit device of claim 9, wherein the interconnect comprises:
a first via in the first dielectric layer and a second via in the second dielectric layer, the first via is a via having a largest dimension in the first dielectric layer, and the second via is a via having a largest dimension in the second dielectric layer;

a top area of the TIV is greater than a top area of the second via; and a bottom area of the TIV is greater than a bottom area of the first via.

11. The integrated circuit device of claim 9, wherein the TIV tapers toward the substrate.

12. The integrated circuit device of claim 9, wherein the through interconnect via comprises:

a conductive filling layer; and a barrier layer surrounding the conductive filling layer.

13. The integrated circuit device of claim 12, wherein the conductive filling layer is free from a barrier layer.

14. The integrated circuit device of claim 12, wherein the conductive filling layer is free from a dielectric layer.

15. The integrated circuit device of claim 12, wherein the volume of the conductive filling layer is 3.5 times to 4 times the volume of the barrier layer.

16. A method of fabricating an integrated circuit device, comprising:

forming a dielectric structure on a top surface of a substrate, comprising:
    forming a first dielectric layer on the substrate; and
    forming a second dielectric layer over the first dielectric layer;

forming an interconnect in the dielectric structure, wherein the interconnect comprises a plurality of conductive layers and a plurality of vias between the plurality of conductive layers;

forming a through interconnect via opening in the dielectric structure, the through interconnect via opening at least extending from the first dielectric layer to the second dielectric layer;

forming a through interconnect via (TIV) in the through interconnect via opening;

forming a passivation layer on the dielectric structure; and forming a plurality of conductive pads on the passivation layer, electrically connecting the TIV and the interconnect, respectively, wherein a bottom surface of the through interconnect via is higher than the top surface of the substrate.

17. The method of claim 16, wherein the forming the through interconnect via in the through interconnect via opening comprises:

forming a barrier layer on a sidewall and a bottom surface of the through interconnect via opening; and forming a conductive filling layer on the barrier layer in the through interconnect via opening.

18. The method of claim 16, wherein the forming the first dielectric layer on the substrate comprises:

forming a first dielectric material layer on the substrate; and forming a second dielectric material layer on the first material layer;

wherein the through interconnect via opening extends from the first dielectric material layer to the second dielectric layer.

19. The method of claim 16, further comprising:

forming a top conductive layer in the second dielectric layer on the through interconnect via before forming a passivation layer on the dielectric structure.

20. The method of claim 16, wherein the forming the dielectric structure on the substrate further comprises forming a third dielectric layer on the substrate prior to forming the first dielectric layer; and the forming the interconnect in the dielectric structure further comprises forming a bottom conductive layer in the third dielectric layer, wherein a bottom of the through interconnect via opening exposes the bottom conductive layer.

* * * * *